US012308079B2

(12) United States Patent
Wei et al.

(10) Patent No.: US 12,308,079 B2
(45) Date of Patent: May 20, 2025

(54) SHIFT REGISTER, GATE DRIVING CIRCUIT AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Liheng Wei, Beijing (CN); Huijuan Yang, Beijing (CN); Tingliang Liu, Beijing (CN); Yi Zhang, Beijing (CN); Xiaoqing Shu, Beijing (CN); Lingtong Li, Beijing (CN); Maoying Liao, Beijing (CN); Tianci Chen, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/027,321

(22) PCT Filed: Jun. 28, 2022

(86) PCT No.: PCT/CN2022/101950
§ 371 (c)(1),
(2) Date: Mar. 20, 2023

(87) PCT Pub. No.: WO2023/178868
PCT Pub. Date: Sep. 28, 2023

(65) Prior Publication Data
US 2024/0355403 A1    Oct. 24, 2024

(30) Foreign Application Priority Data

Mar. 24, 2022 (WO) ................ PCT/CN2022/082794

(51) Int. Cl.
*G11C 19/28* (2006.01)
*G09G 3/20* (2006.01)

(52) U.S. Cl.
CPC ............... *G11C 19/28* (2013.01); *G09G 3/20* (2013.01); *G09G 2310/0286* (2013.01)

(58) Field of Classification Search
CPC ... G11C 19/28; G09G 3/20; G09G 2310/0286
See application file for complete search history.

(56) References Cited

U.S. PATENT DOCUMENTS 7,705,843 B2 *  4/2010  Osame ................. G09G 3/3688
                                                    345/98
11,024,399 B2 *  6/2021  Liang .................. G09G 3/3674
(Continued)

FOREIGN PATENT DOCUMENTS

CN          103295511 A      9/2013
CN          103714770 A      4/2014
(Continued)

OTHER PUBLICATIONS

International Search Report dated Dec. 27, 2022 issued in corresponding International Application No. PCT/CN2022/082791.

*Primary Examiner* — Benyam Ketema
(74) *Attorney, Agent, or Firm* — Nath, Goldberg & Meyer; Joshua B. Goldberg

(57) ABSTRACT

The disclosure provides a shift register including: input circuit configured to write signal from signal input terminal to third node in response to signal from first clock signal terminal; first control circuit configured to write voltage from first power terminal into first node in response to signals from preset control signal terminal and preset clock signal terminal; second control circuit configured to write voltage from second power terminal to first node in response to signal from signal input terminal; and output circuit configured to write voltage from second power terminal to (Continued)

signal output terminal in response to voltage at first node, and to write voltage from first power terminal to signal output terminal in response to voltage at fourth node. Third node is coupled to fourth node. The present disclosure further provides a gate driving circuit and a display apparatus.

18 Claims, 16 Drawing Sheets

(56) References Cited

U.S. PATENT DOCUMENTS

| | | |
|---|---|---|
| 2002/0167026 A1 | 11/2002 | Azami et al. |
| 2011/0273418 A1* | 11/2011 | Park ................ H05B 45/60 345/76 |
| 2018/0144702 A1 | 5/2018 | Furuta et al. |
| 2019/0051365 A1* | 2/2019 | Li ..................... G09G 3/20 |
| 2019/0073933 A1* | 3/2019 | Xuan ................ G11C 19/28 |
| 2020/0273503 A1* | 8/2020 | Wang ............... G09G 3/3677 |
| 2021/0134203 A1* | 5/2021 | Wang ............... G09G 3/3266 |
| 2021/0150970 A1* | 5/2021 | Zheng .............. G09G 3/20 |
| 2021/0200351 A1* | 7/2021 | Yang ................ G09G 3/3677 |
| 2021/0201806 A1* | 7/2021 | Feng ................ G11C 19/28 |
| 2022/0051608 A1* | 2/2022 | Shang .............. G09G 3/2092 |
| 2022/0051628 A1 | 2/2022 | Dai et al. |
| 2022/0319410 A1* | 10/2022 | Yu .................... H10K 59/131 |
| 2022/0327988 A1* | 10/2022 | Hu .................... G09G 3/2092 |
| 2023/0215333 A1* | 7/2023 | Hu .................... G09G 3/2092 345/204 |
| 2023/0260462 A1* | 8/2023 | Chen ................ G09G 3/3266 345/214 |

FOREIGN PATENT DOCUMENTS

| | | | | |
|---|---|---|---|---|
| CN | 106652867 A | | 5/2017 | |
| CN | 107863057 A | * | 3/2018 | ............ G09G 3/20 |
| CN | 108122538 A | | 6/2018 | |
| CN | 108538257 A | | 9/2018 | |
| CN | 110070822 A | | 7/2019 | |
| CN | 110391270 A | | 10/2019 | |
| CN | 110415637 A | | 11/2019 | |
| CN | 110706656 A | | 1/2020 | |
| CN | 111145678 A | | 5/2020 | |
| CN | 113112955 A | | 7/2021 | |
| CN | 113113071 A | | 7/2021 | |
| CN | 113763886 A | * | 12/2021 | |
| CN | 113785352 A | | 12/2021 | |
| CN | 113785353 A | | 12/2021 | |
| CN | 113939914 A | | 1/2022 | |
| KR | 20140131137 A | | 11/2014 | |

* cited by examiner

SHIFT REGISTER, GATE DRIVING CIRCUIT AND DISPLAY APPARATUS

CROSS REFERENCE TO RELATED APPLICATIONS

This is a National Phase Application filed under 35 U.S.C. 371 as a national stage of PCT/CN2022/101950, filed on Jun. 28, 2022, an application claiming the priority of the PCT International Patent Application No. PCT/CN2022/082794 filed on Mar. 24, 2022, the contents of each of which are incorporated herein by reference in its entirety.

TECHNICAL FIELD

The present disclosure relates to the field of display technology, in particular to a shift register, a gate driving circuit and a display apparatus.

BACKGROUND

With the development of display technology, a light emitting control transistor for controlling a driving transistor to output a driving current is generally disposed in a pixel driving circuit, and the light emitting control transistor is generally controlled by a light emitting control signal line. A corresponding gate driving circuit for light emitting control needs to be provided for the light emitting control signal line.

In the prior art, transistors in the gate driving circuit for light emitting control are integrated on an array substrate by using a gate driver on array (GOA) technology, to scan and drive the light emitting control signal lines in a display panel, so that a gate driver IC can be omitted, and a narrow bezel can be realized.

However, in practical applications, it has been found that the circuit configuration of the shift register in the conventional gate driving circuit for light emitting control is complicated and occupies a large space.

SUMMARY

The present disclosure aims to solve at least one of the technical problems in the prior art, and provides a shift register, a gate driving circuit and a display apparatus.

In a first aspect, an embodiment of the present disclosure provides a shift register, including: an input circuit coupled to a signal input terminal, a first clock signal terminal, and a third node, and configured to write a signal from the signal input terminal to the third node in response to control of a signal from the first clock signal terminal; a first control circuit coupled to a first power terminal, a preset control signal terminal, a preset clock signal terminal, and a first node, and configured to write a voltage from the first power terminal to the first node in response to control of signals from the preset control signal terminal and the preset clock signal terminal; a second control circuit coupled to a second power terminal, the signal input terminal, and the first node, and configured to write a voltage from the second power terminal to the first node in response to control of the signal from the signal input terminal; and an output circuit coupled to a signal output terminal, the first power terminal, the second power terminal, the first node, and a fourth node, and configured to write a voltage from the second power terminal to the signal output terminal in response to control of a voltage at the first node, and to write the voltage from the first power terminal to the signal output terminal in response to control of a voltage at the fourth node, wherein the third node is coupled to the fourth node.

In some embodiments, the first control circuit includes a first transistor and a second transistor; a control electrode of the first transistor is coupled to the preset control signal terminal, a first electrode of the first transistor is coupled to the first power terminal, and a second electrode of the first transistor is coupled to a first electrode of the second transistor; and a control electrode of the second transistor is coupled to the preset clock signal terminal, and a second electrode of the second transistor is coupled to the first node.

In some embodiments, the first control circuit includes a first transistor and a second transistor; a control electrode of the first transistor is coupled to the preset control signal terminal, a first electrode of the first transistor is coupled to a second electrode of the second transistor, and a second electrode of the first transistor is coupled to the first node; and a control electrode of the second transistor is coupled to the preset clock signal terminal, and a first electrode of the second transistor is coupled to the first power terminal.

In some embodiments, the preset control signal terminal is the third node.

In some embodiments, the preset control signal terminal is the signal input terminal.

In some embodiments, the first transistor is an N-type transistor, and all transistors except the first transistor in the shift register are P-type transistors.

In some embodiments, the first transistor is a metal oxide transistor, and all transistors except the first transistor in the shift register are low temperature polysilicon transistors.

In some embodiments, the second control circuit includes: a third transistor; and a control electrode of the third transistor is coupled to the signal input terminal, a first electrode of the third transistor is coupled to the second power terminal, and a second electrode of the third transistor is coupled to the first node.

In some embodiments, the input circuit includes: a fourth transistor; and a control electrode of the fourth transistor is coupled to the first clock signal terminal, a first electrode of the fourth transistor is coupled to the signal input terminal, and a second electrode of the fourth transistor is coupled to the third node.

In some embodiments, the output circuit includes a seventh transistor and an eighth transistor; a control electrode of the seventh transistor is coupled to the fourth node, a first electrode of the seventh transistor is coupled to the first power terminal, and a second electrode of the seventh transistor is coupled to the signal output terminal; and a control electrode of the eighth transistor is coupled to the first node, a first electrode of the eighth transistor is coupled to the signal output terminal, and a second electrode of the eighth transistor is coupled to the second power terminal.

In some embodiments, the shift register further includes: a noise reduction circuit coupled to the second power terminal, the first node, and the third node and configured to write the voltage from the second power terminal to the third node in response to control of a voltage at the first node.

In some embodiments, the noise reduction circuit includes a fifth transistor; and a control electrode of the fifth transistor is coupled to the first node, a first electrode of the fifth transistor is coupled to the third node, and a second electrode of the fifth transistor is coupled to the second power terminal.

In some embodiments, the shift register further includes: a first capacitor; wherein a first terminal of the first capacitor is coupled to a second clock signal terminal, and a second terminal of the first capacitor is coupled to the fourth node.

In some embodiments, the shift register further includes: a sixth transistor between the third node and the fourth node, wherein the third node is coupled to the fourth node through the sixth transistor; and a control electrode of the sixth transistor is coupled to the first power terminal, a first electrode of the sixth transistor is coupled to the third node, and a second electrode of the sixth transistor is coupled to the fourth node.

In some embodiments, the preset clock signal terminal is the first clock signal terminal or the second clock signal terminal.

In some embodiments, the shift register further includes: a second capacitor; wherein a first terminal of the second capacitor is coupled to the first node, and a second terminal of the second capacitor is coupled to the first power terminal or the second power terminal.

In a second aspect, an embodiment of the present disclosure further provides a gate driving circuit, including: a plurality of shift registers cascaded, wherein each of the shift registers is the shift register provided by the first aspect; a signal input terminal of a shift register at the first stage is coupled to a frame start signal terminal; and a signal input terminal of a shift register at any stage other than the first stage is coupled to a signal output terminal of a shift register at a previous stage.

In a third aspect, an embodiment of the present disclosure further provides a display apparatus, including: the gate driving circuit as provided in the second aspect.

DETAIL DESCRIPTION OF EMBODIMENTS

In order to enable one of ordinary skill in the art to better understand the technical solutions of the embodiments of the present disclosure, a shift register, a gate driving circuit and a display apparatus of the present disclosure will be described in further detail with reference to the accompanying drawings.

It should be noted that a transistor in the present disclosure may be a thin film transistor, a field effect transistor, or other switching device having the same characteristics. The transistor generally includes three electrodes: a gate electrode, a source electrode and a drain electrode, structures of the source electrode and the drain electrode in the transistor are symmetrical, and thus, the source electrode and the drain electrode are interchangeable as required. In the present disclosure, a control electrode refers to the gate electrode of the transistor, and one of a first electrode and a second electrode is the source electrode and the other is the drain electrode.

Further, transistors may be classified into N-type transistors and P-type transistors according to transistor characteristics; when the transistor is an N-type transistor, an on voltage of the transistor is a high level voltage, and an off voltage of the transistor is a low level voltage; when the transistor is a P-type transistor, the on voltage is a low level voltage and the off voltage is a high level voltage.

Figure 1A:
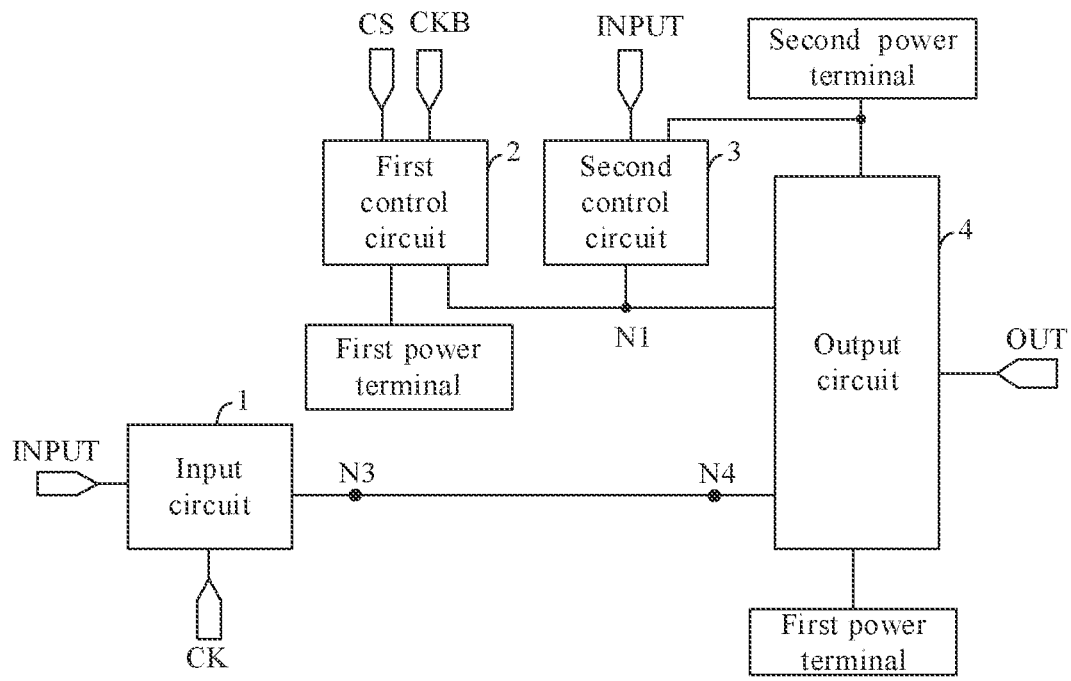
FIG. 1A is a schematic diagram of a circuit structure of a shift register according to an embodiment of the present disclosure.
Figure 1B:
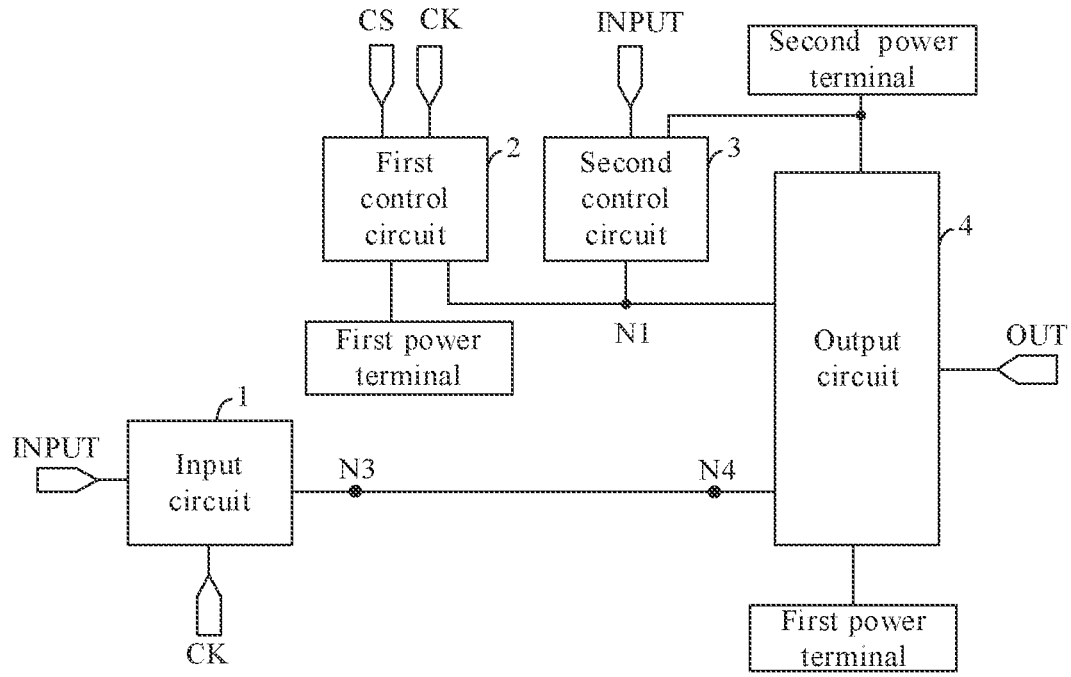
FIG. 1B is a schematic diagram of another circuit structure of a shift register according to an embodiment of the present disclosure.

FIG. 1A is a schematic diagram of a circuit structure of a shift register according to an embodiment of the present disclosure; FIG. 1B is a schematic diagram of another circuit structure of a shift register according to an embodiment of the present disclosure; as shown in FIG. 1A and FIG. 1B, a shift register provided by an embodiment of the present disclosure includes a shift register in a gate driving circuit for light emitting control, which is coupled to a light emitting control signal line in a corresponding row in a display apparatus to provide a corresponding light emitting control signal to the light emitting control signal line, and includes an input circuit 1, a first control circuit 2, a second control circuit 3, and an output circuit 4.

The input circuit 1 is coupled to a signal input terminal INPUT, a first clock signal terminal CK, and a third node N3, and is configured to write a signal provided by the signal input terminal INPUT to the third node N3 in response to control of a signal provided by the first clock signal terminal CK.

The first control circuit 2 is coupled to a first power terminal, a preset control signal terminal CS, a second clock signal terminal CKB, and a first node N1, and is configured to write a voltage provided by the first power terminal into the first node N1 in response to control of signals provided by the preset control signal terminal CS and a preset clock signal terminal.

The second control circuit 3 is coupled to a second power terminal, the signal input terminal INPUT, and the first node N1, and is configured to write a voltage s provided by the second power terminal to the first node N1 in response to control of a signal provided by the signal input terminal INPUT.

The output circuit 4 is coupled to a signal output terminal OUT, the first power terminal, the second power terminal, the first node N1, and a fourth node N4, and is configured to write a voltage provided by the second power terminal to the signal output terminal OUT in response to control of a voltage at the first node N1, and to write a voltage provided by the first power terminal to the signal output terminal OUT in response to control of a voltage at the fourth node N4, the third node N3 is coupled to the fourth node N4.

In some embodiments, the preset clock signal terminal is the first clock signal terminal CK or the second clock signal terminal CKB. FIG. 1A illustrates that the preset clock signal terminal is the second clock signal terminal CKB; and FIG. 1B illustrates that the preset clock signal terminal is the first clock signal terminal CK.

The shift register provided by the embodiment of the present disclosure has the advantages of simple circuit structure and small occupied space, which are beneficial for the narrow bezel design of the display apparatus.

Figure 2A:
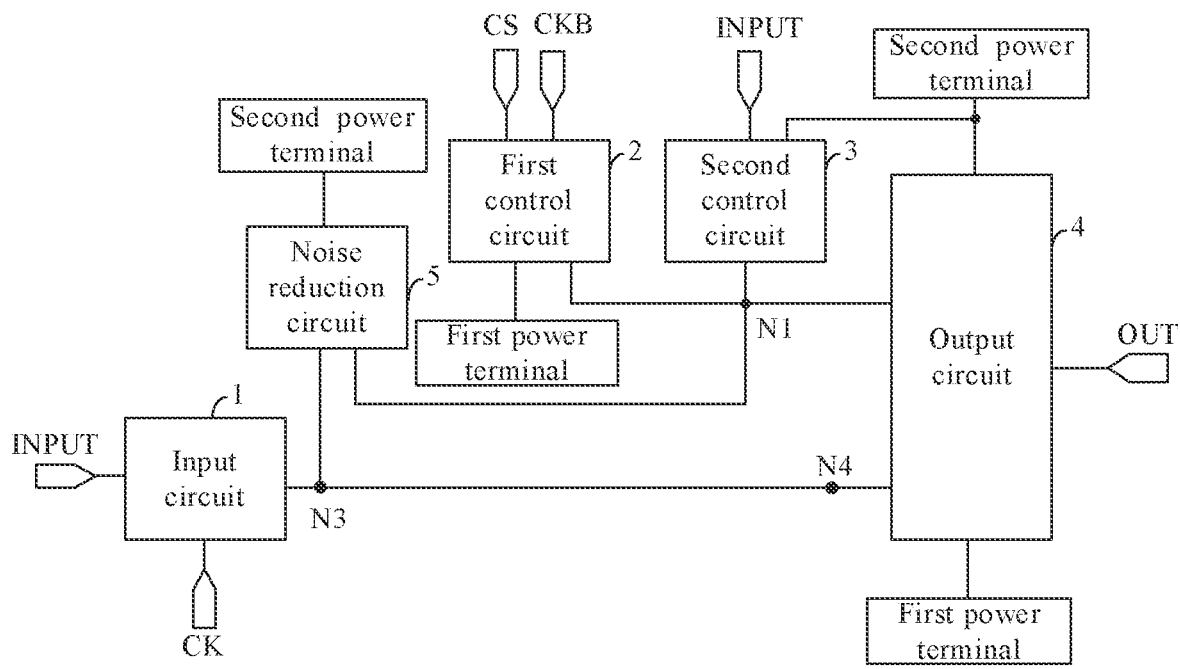
FIG. 2A is a schematic diagram of another specific circuit structure of a shift register according to an embodiment of the present disclosure.
Figure 2B:
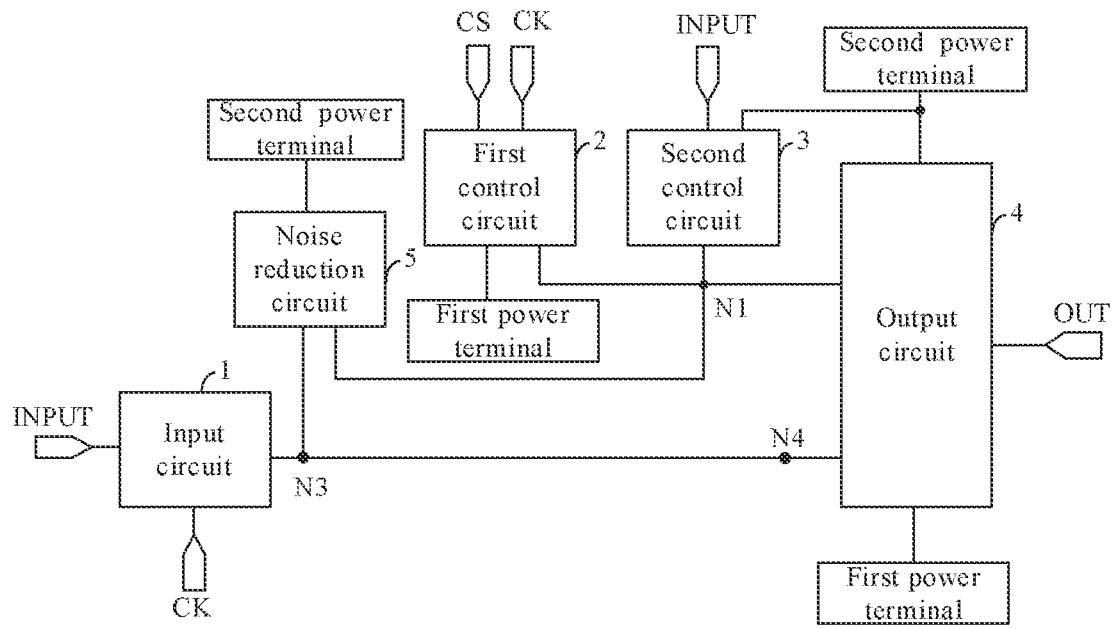
FIG. 2B is a schematic diagram of another specific circuit structure of a shift register according to an embodiment of the present disclosure.

FIG. 2A is a schematic diagram of another specific circuit structure of a shift register according to an embodiment of the present disclosure; FIG. 2B is a schematic diagram of another specific circuit structure of a shift register according to an embodiment of the present disclosure; as shown in FIG. 2A and FIG. 2B, in some embodiments, the shift register further includes: a noise reduction circuit 5 coupled to the second power terminal, the first node N1, and the third node N3, and is configured to write a voltage provided by the second power terminal to the third node N3 in response to control of the voltage at the first node N1.

In the embodiment of the present disclosure, by providing the noise reduction circuit 5, the noise reduction processing can be performed on the third node N3 during operation of the shift register.

Figure 3A:
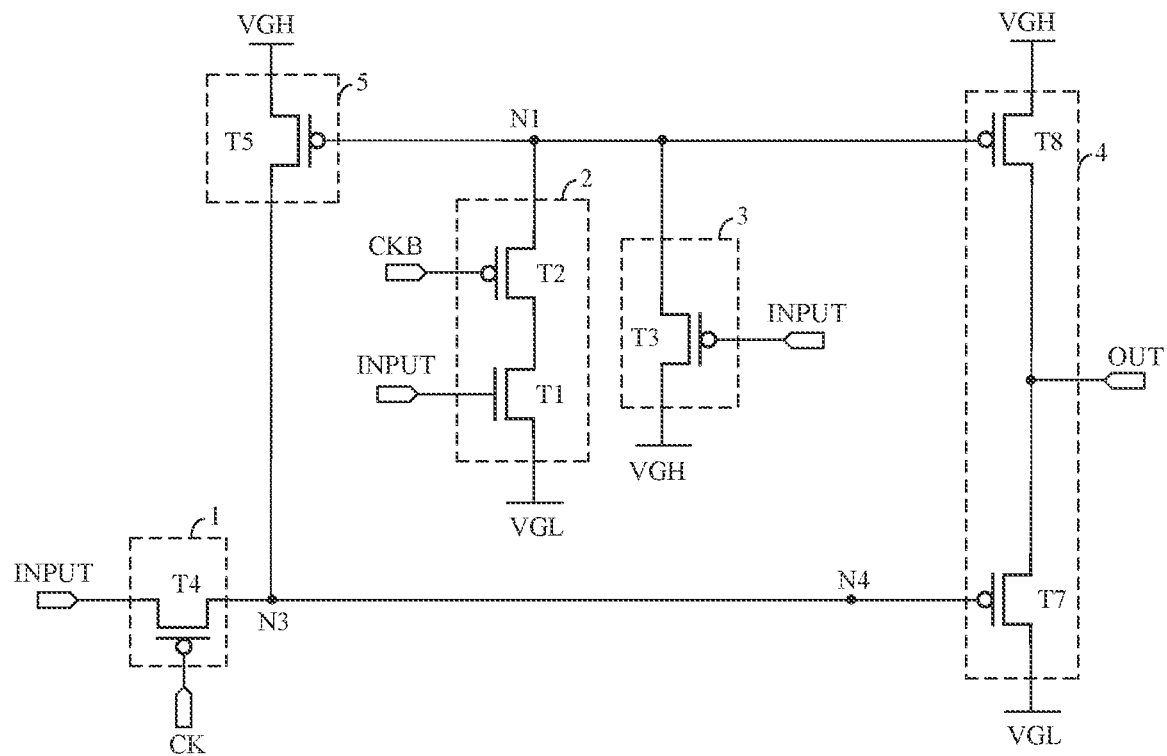
FIG. 3A is a schematic diagram of another specific circuit structure of a shift register according to an embodiment of the present disclosure.
Figure 3B:
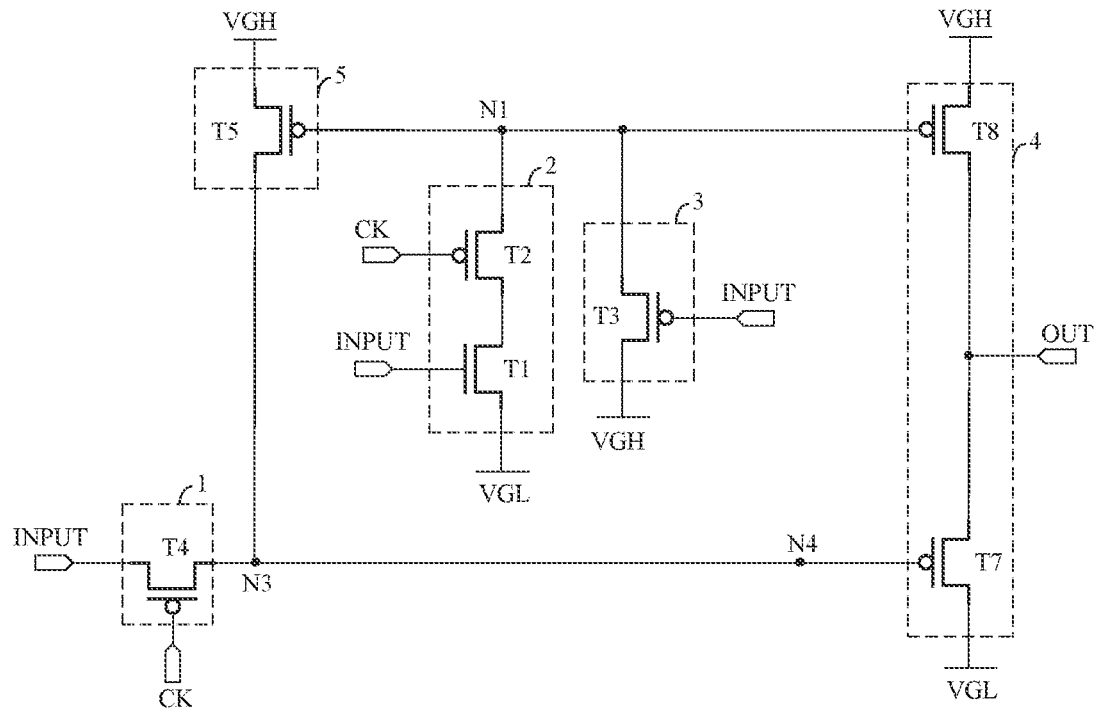
FIG. 3B is a schematic diagram of another specific circuit structure of a shift register according to an embodiment of the present disclosure.

FIG. 3A is a schematic diagram of another specific circuit structure of a shift register according to an embodiment of the present disclosure; FIG. 3B is a schematic diagram of another specific circuit structure of a shift register according to an embodiment of the present disclosure; as shown in FIG. 3A and FIG. 3B, the shift register shown in FIG. 3A is an embodiment based on the shift register shown in FIG. 2A; the shift register shown in FIG. 3B is an embodiment based on the shift register shown in FIG. 2B.

In some embodiments, the first control circuit 2 includes a first transistor T1 and a second transistor T2, the second control circuit 3 includes a third transistor T3, the input circuit 1 includes a fourth transistor T4, the noise reduction circuit 5 includes a fifth transistor T5, and the output circuit 4 includes a seventh transistor T7 and an eighth transistor T8.

A control electrode of the first transistor T1 is coupled to the preset control signal terminal CS, a first electrode of the first transistor T1 is coupled to the first power terminal, and a second electrode of the first transistor T1 is coupled to a first electrode of the second transistor T2;

A control electrode of the second transistor T2 is coupled to the second clock signal terminal CKB (shown in FIG. 3A) or the first clock signal terminal CK (shown in FIG. 3B), and a second electrode of the second transistor T2 is coupled to the first node N1.

A control electrode of the third transistor T3 is coupled to the signal input terminal INPUT, a first electrode of the third transistor T3 is coupled to the second power terminal, and a second electrode of the third transistor T3 is coupled to the first node N1.

A control electrode of the fourth transistor T4 is coupled to the first clock signal terminal CK, a first electrode of the fourth transistor T4 is coupled to the signal input terminal INPUT, and a second electrode of the fourth transistor T4 is coupled to the third node N3.

A control electrode of the fifth transistor T5 is coupled to the first node N1, a first electrode of the fifth transistor T5 is coupled to the third node N3, and a second electrode of the fifth transistor T5 is coupled to the second power terminal.

A control electrode of the seventh transistor T7 is coupled to the fourth node N4, a first electrode of the seventh transistor T7 is coupled to the first power terminal, and a second electrode of the seventh transistor T7 is coupled to the signal output terminal OUT.

A control electrode of the eighth transistor T8 is coupled to the first node N1, a first electrode of the eighth transistor T8 is coupled to the signal output terminal OUT, and a second electrode of the eighth transistor T8 is coupled to the second power terminal.

In some embodiments, the preset control signal terminal CS is the signal input terminal INPUT. In the embodiment of the present disclosure, the signal input terminal INPUT is used as the preset control signal terminal CS, so that it is unnecessary to provide additional control signal terminals, thereby effectively reducing the number of signal terminals provided in the shift register, and facilitating reducing the control difficulty for the shift register.

In some embodiments, the first transistor T1 is an N-type transistor, and all transistors in the shift register except the first transistor T1 are P-type transistors.

At present, the pixel driving circuit in the display apparatus is developed towards the low temperature polycrystalline oxide (LTPO) technology, that is, the pixel driving circuit includes two types of transistors: low temperature polysilicon type transistors and metal oxide type transistors. Since the GOA circuit and the pixel driving circuit are synchronously fabricated through the same process, in order to adapt to the fabrication process of the LTPO type pixel driving circuit, the transistors in the shift register are also designed to include both low temperature polysilicon type transistors and metal oxide type transistors. In some embodiments, the N-type transistor is the metal oxide type transistor, and the P-type transistors are the low temperature polysilicon type transistor. That is, the first transistor T1 is the metal oxide transistor, and all the transistors in the shift register except the first transistor T1 are the low temperature polysilicon transistors.

The operation of the shift register shown in FIGS. 2A and 2B will be described in detail with reference to the accompanying drawings. In an exemplary embodiment, the first transistor T1 is the N-type transistor, the second transistor T2, the third transistor T3, the fourth transistor T4, the fifth transistor T5, the seventh transistor T7, and the eighth transistor T8 are all the P-type transistors, the first power terminal provides a low level voltage VGL, and the second power terminal provides a high level voltage VGH.

Figure 4A:
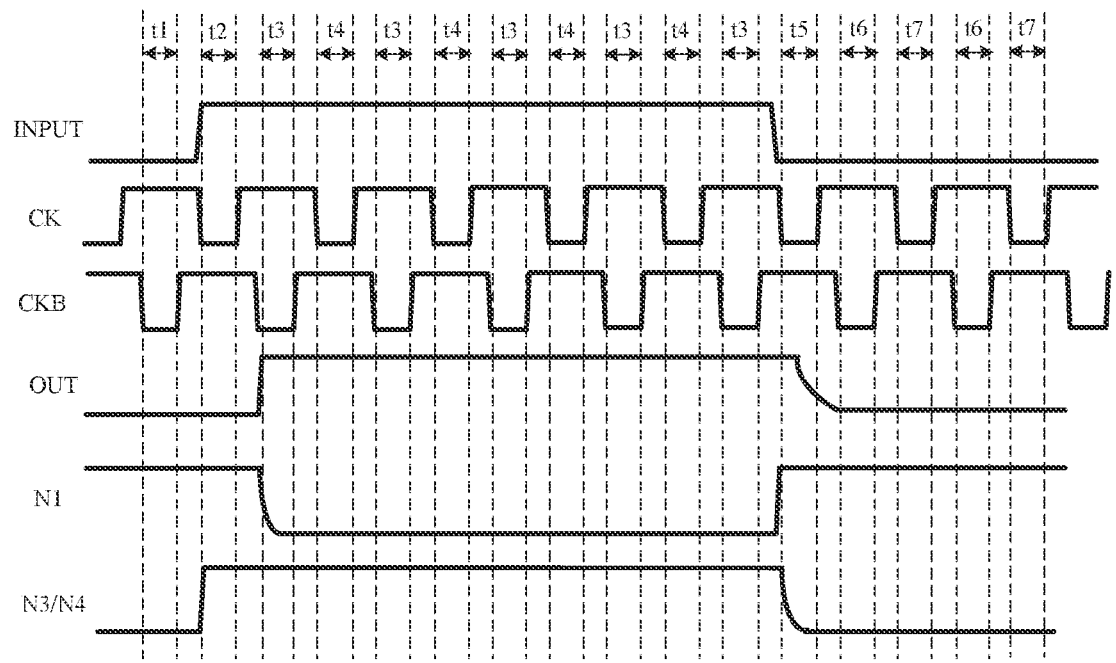
FIG. 4A is a timing diagram illustrating an operation of a shift register shown in FIG. 3A.

FIG. 4A is a timing diagram illustrating an operation of a shift register shown in FIG. 3A; as shown in FIG. 4A, the operation of the shift register includes the following stages.

In a first stage t1, the signal provided by the signal input terminal INPUT is at a low level state, the signal provided by the first clock signal terminal CK is at a high level state, and the signal provided by the second clock signal terminal CKB is at a low level state.

Since the signal provided by the second clock signal terminal CKB is at the low level state, the second transistor T2 is turned on.

Since the signal provided by the signal input terminal INPUT is at the low level state, the first transistor T1 is turned off, the third transistor T3 is turned on, the high level voltage VGH provided by the second power terminal is written to the first node N1 through the third transistor T3, the voltage at the first node N1 is at the high level state, and the fifth transistor T5 and the eighth transistor T8 are both turned off.

Since the signal provided by the first clock signal terminal CK is at the high level state, the fourth transistor T4 is turned off, the third node N3 and the fourth node N4 are both in a floating state (floating), the voltages at the third node N3 and the fourth node N4 remain in the low level state in the previous stage, the seventh transistor T7 remains turned on, the low level signal provided by the first power terminal is written into the signal output terminal OUT through the seventh transistor T7, and the signal output terminal OUT outputs the low level signal.

In a second stage t2, the signal provided by the signal input terminal INPUT is at a high level state, the signal provided by the first clock signal terminal CK is at a low level state, and the signal provided by the second clock signal terminal CKB is at a high level state.

Since the signal provided by the second clock signal terminal CKB is at the high level state, the second transistor T2 is turned off.

Since the signal provided by the signal input terminal INPUT is at the high level state, the first transistor T1 is turned on, and the third transistor T3 is turned off. At this time, the first node N1 is in a floating state and remains in the high level state of the previous stage. At this time, both the fifth transistor T5 and the eighth transistor T8 remain turned off.

Since the signal provided by the first clock signal terminal CK is at the low level state, the fourth transistor T4 is turned on, the high level signal provided by the signal input terminal INPUT is written into the third node N3 through the fourth transistor T4, and the voltages at the third node N3 and the fourth node N4 are at the high level state. At this time, the seventh transistor T7 is turned off. The signal output terminal OUT is in the floating state, and remains in the low level state of the previous stage, that is, the signal output terminal OUT outputs the low level signal.

In a third stage t3, the signal provided by the signal input terminal INPUT is at a high level state, the signal provided by the first clock signal terminal CK is at a high level state, and the signal provided by the second clock signal terminal CKB is at a low level state.

Since the signal provided by the second clock signal terminal CKB is at the low level state, the second transistor T2 is turned on.

Since the signal provided by the signal input terminal INPUT is at the high level state, the first transistor T1 is turned on, the third transistor T3 is turned off, and at this time, the low level voltage VGL provided by the first power terminal is written to the first node N1 through the first transistor T1 and the second transistor T2, the voltage at the first node N1 is at the low level state, and the fifth transistor T5 and the eighth transistor T8 are both turned on.

Since the signal provided by the first clock signal terminal CK is at the high level state, the fourth transistor T4 is turned off. However, since the fifth transistor T5 is turned on, the high level voltage VGH provided by the second power terminal is written to the third node N3 through the fifth transistor T5, so as to reduce the noise of the voltage at the third node N3. At this time, the seventh transistor T7 remains turned off.

Since the eighth transistor T8 is turned on, the high level voltage VGH provided by the second power terminal may be written to the signal output terminal OUT through the eighth transistor T8, and thus the signal output terminal OUT outputs a high level signal.

Based on the above, in the third stage t3, the noise reduction circuit 5 (the fifth transistor T5) can reduce the noise of the voltage at the third node N3, and the noise reduction circuit 5 (the fifth transistor T5) is not a necessary circuit structure in the shift register according to the embodiment of the present disclosure, so that the noise reduction circuit 5 can be removed according to actual needs (for example, simplifying the circuit structure and reducing the occupied size of the shift register) in some embodiments.

In a fourth stage t4, the signal provided by the signal input terminal INPUT is at a high level state, the signal provided by the first clock signal terminal CK is at a low level state, and the signal provided by the second clock signal terminal CKB is at a high level state.

Since the signal provided by the second clock signal terminal CKB is at the high level state, the second transistor T2 is turned off.

Since the signal provided by the signal input terminal INPUT is at the high level state, the first transistor T1 is turned on, and the third transistor T3 is turned off. At this time, the first node N1 is in a floating state and remains in the low level state of the previous stage, and both the fifth transistor T5 and the eighth transistor T8 remain turned on.

Since the signal provided by the first clock signal terminal CK is at the low level state, the fourth transistor T4 is turned on, the high level signal provided by the signal input terminal INPUT is written into the third node N3 through the fourth transistor T4, and the voltages at the third node N3 and the fourth node N4 are at the high level state. At this time, the seventh transistor T7 is turned off. The signal output terminal OUT is in a floating state, and remains in the high level state of the previous stage, that is, the signal output terminal OUT outputs a high level signal.

It should be noted that according to a pulse width design of the input signal, each period may include a plurality of third stages t3 and a plurality of fourth stages t4 which are performed alternately.

In a fifth stage t5, the signal provided by the signal input terminal INPUT is at a low level, the signal provided by the first clock signal terminal CK is at a low level, and the signal provided by the second clock signal terminal CKB is at a high level.

Since the signal provided by the second clock signal terminal CKB is at the high level state, the second transistor T2 is turned off.

Since the signal provided by the signal input terminal INPUT is at the low level state, the first transistor T1 is turned off, the third transistor T3 is turned on, and at this time, the high level voltage VGH provided by the second power terminal is written into the first node N1 through the third transistor T3, the voltage at the first node N1 is at the high level state, and the fifth transistor T5 and the eighth transistor T8 are both turned off.

Since the signal provided by the first clock signal terminal CK is at the low level state, the fourth transistor T4 is turned on. The low level signal provided by the signal input terminal INPUT is written to the third node N3 through the fourth transistor T4, and the voltages at the third node N3 and the fourth node N4 are at the low level state. At this time, the seventh transistor T7 is turned on.

Since the seventh transistor T7 is turned on, the low level voltage VGL provided by the first power terminal is written to the signal output terminal OUT through the seventh transistor T7, and thus the signal output terminal OUT outputs a low level signal. It should be noted that during the fifth stage, the voltage at the third node N3 and the fourth node N4 will slowly decrease, and the seventh transistor T7 will slowly switch from the off state to the on state, so that the signal output by the signal output terminal OUT is slowly switched from the high level state to the low level state. That is, during the fifth stage, the signal output terminal OUT actually outputs a high level signal and then outputs a low level signal. A timing at which the signal output terminal OUT outputs a low level signal is related to a discharging speed of the fourth node N4 (an operating state of the seventh transistor T7).

In a sixth stage t6, the signal provided by the signal input terminal INPUT is at a low level state, the signal provided by the first clock signal terminal CK is at a high level state, and the signal provided by the second clock signal terminal CKB is at a low level state.

Since the signal provided by the second clock signal terminal CKB is at the low level state, the second transistor T2 is turned on.

Since the signal provided by the signal input terminal INPUT is at the low level state, the first transistor T1 is turned off, the third transistor T3 is turned on, and at this time, the high level voltage VGH provided by the second power terminal is written into the first node N1, the voltage at the first node N1 is at the high level state, and the fifth transistor T5 and the eighth transistor T8 are both turned off.

Since the signal provided by the first clock signal terminal CK is at the high level state, the fourth transistor T4 is turned off. At this time, the third node N3 and the fourth node N4 are in a floating state and remain in the low level in the previous stage. The seventh transistor T7 remains turned on.

Since the seventh transistor T7 is turned on, the low level voltage VGL provided by the first power terminal is written to the signal output terminal OUT through the seventh transistor T7, and thus the signal output terminal OUT outputs a low level signal.

In a seventh stage t7, the signal provided by the signal input terminal INPUT is at a low level state, the signal provided by the first clock signal terminal CK is at a low level state, and the signal provided by the second clock signal terminal CKB is at a high level state.

Since the signal provided by the second clock signal terminal CKB is at the high level state, the second transistor T2 is turned off.

Since the signal provided by the signal input terminal INPUT is at the low level state, the first transistor T1 is turned off, the third transistor T3 is turned on, and at this time, the high level voltage VGH provided by the second power terminal is written into the first node N1 through the third transistor T3, the voltage at the first node N1 is at the high level state, and the fifth transistor T5 and the eighth transistor T8 are both turned off.

Since the signal provided by the first clock signal terminal CK is at the low level state, the fourth transistor T4 is turned on. A low level signal provided by the signal input terminal INPUT is written to the third node N3 through the fourth transistor T4 to perform the noise reduction processing on the third node N3, and voltages at the third node N3 and the fourth node N4 are at the low level state. At this time, the seventh transistor T7 is turned on.

Since the seventh transistor T7 is turned on, the low level voltage VGL provided by the first power terminal is written to the signal output terminal OUT through the seventh transistor T7, and thus the signal output terminal OUT outputs a low level signal.

It should be noted that according to the one-frame duration design, each period includes a plurality of sixth stages t6 and a plurality of seventh stages t7 which are performed alternately until the first stage of the next period starts.

Figure 4B:
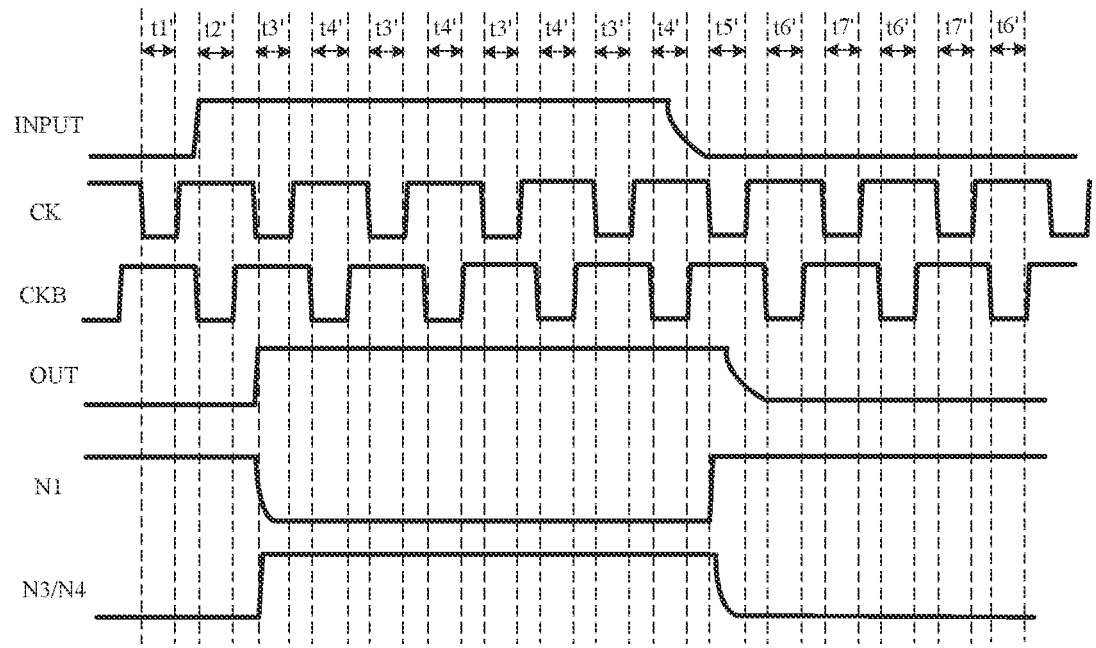
FIG. 4B is a timing diagram illustrating an operation of a shift register shown in FIG. 3B.

FIG. 4B is a timing diagram illustrating an operation of a shift register shown in FIG. 3B; as shown in FIG. 4B, the operation of the shift register includes the following stages:

In a first stage t1', the signal provided by the signal input terminal INPUT is at a low level, the signal provided by the first clock signal terminal CK is at a low level, and the signal provided by the second clock signal terminal CKB is at a high level.

Since the signal provided by the signal input terminal INPUT is at the low level state, the first transistor T1 is turned off, the third transistor T3 is turned on, the high level voltage VGH provided by the second power terminal is written to the first node N1 through the third transistor T3, the voltage at the first node N1 is at the high level state, and the fifth transistor T5 and the eighth transistor T8 are both turned off.

Since the signal provided by the first clock signal terminal CK is at the low level state, both the second transistor and the fourth transistor T4 are turned on, and at this time, the low level signal provided by the signal input terminal INPUT can be written into the third node N3 and the fourth node N4 through the fourth transistor, the voltages at the third node N3 and the fourth node N4 are at the low level state, and at this time, the seventh transistor T7 remains turned on, and the low level signal provided by the first power terminal is written into the signal output terminal OUT through the seventh transistor T7, so the signal output terminal OUT outputs the low level signal.

In a second stage t2', the signal provided by the signal input terminal INPUT is at a high level state, the signal provided by the first clock signal terminal CK is at a high level state, and the signal provided by the second clock signal terminal CKB is at a low level state.

Since the signal provided by the signal input terminal INPUT is at the high level state, the first transistor T1 is turned on, and the third transistor T3 is turned off. At this time, the first node N1 is in a floating state and remains in the high level state of the previous stage. At this time, both the fifth transistor T5 and the eighth transistor T8 remain turned off.

Since the signal provided by the first clock signal terminal CK is at the high level state, the second transistor T2 and the fourth transistor T4 are turned off, the third node N3 and the fourth node N4 are in a floating state, that is, the voltages at the third node N3 and the fourth node N4 remains in the low level state of the previous stage, at this time, the seventh transistor T7 remains turned on, the low level signal provided by the first power terminal is written into the signal output terminal OUT through the seventh transistor T7, and the signal output terminal OUT outputs a low level signal.

In a third stage t3', the signal provided by the signal input terminal INPUT is at a high level state, the signal provided by the first clock signal terminal CK is at a low level state, and the signal provided by the second clock signal terminal CKB is at a high level state.

Since the signal provided by the first clock signal terminal CK is at the low level state, both the second transistor T2 and the fourth transistor are turned on.

Since the fourth transistor T4 is turned on, the high level signal provided by the signal input terminal INPUT is written to the third node N3 and the fourth node N4 through the fourth transistor, the voltages at the third node N3 and the fourth node N4 are at the high level state, and the seventh transistor is turned off.

Meanwhile, since the signal provided by the signal input terminal INPUT is at the high level state, the first transistor T1 is turned on, the third transistor T3 is turned off, and at this time, the low level voltage VGL provided by the first power terminal is written into the first node N1 through the first transistor T1 and the second transistor T2, the voltage at the first node N1 is at the low level state, and the fifth transistor T5 and the eighth transistor T8 are both turned on.

Since the fifth transistor T5 is turned on, the high level voltage VGH provided by the second power terminal is written into the third node N3 through the fifth transistor T5, so as to reduce the noise of the voltage at the third node N3.

Since the eighth transistor T8 is turned on, the high level voltage VGH provided by the second power terminal may be written to the signal output terminal OUT through the eighth transistor T8, and thus the signal output terminal OUT outputs a high level signal.

Based on the above, it can be seen that the noise reduction circuit 5 (the fifth transistor T5) can reduce the noise of the voltage at the third node N3 in the third stage t3', and the noise reduction circuit 5 (the fifth transistor T5) is not a necessary circuit structure in the shift register according to the embodiment of the present disclosure, so that the noise reduction circuit 5 can be removed according to actual needs (for example, simplifying the circuit structure and reducing the occupied size of the shift register) in some embodiments.

In a fourth stage t4', the signal provided by the signal input terminal INPUT is at a high level state, the signal provided by the first clock signal terminal CK is at a high level state, and the signal provided by the second clock signal terminal CKB is at a low level state.

Since the signal provided by the first clock signal terminal CK is at the high level state, both the second transistor T2 and the fourth transistor are turned off.

Since the signal provided by the signal input terminal INPUT is at the high level state, the first transistor T1 is turned on, and the third transistor T3 is turned off. At this time, the first node N1 is in a floating state and remains in the low level state of the previous stage, and both the fifth transistor T5 and the eighth transistor T8 remain turned on.

Since the fifth transistor T5 remains turned on, the noise reduction of the voltage at the third node N3 can be maintained.

Since the eighth transistor T8 is turned on, the high level voltage VGH provided by the second power terminal may be written to the signal output terminal OUT through the eighth transistor T8, and thus the signal output terminal OUT continuously outputs a high level signal.

It should be noted that according to the pulse width design of the input signal, each period may include a plurality of third stages t3' and a plurality of fourth stages t4' which are performed alternately.

In a fifth stage t5', the signal provided by the signal input terminal INPUT is at a low level, the signal provided by the first clock signal terminal CK is at a low level, and the signal provided by the second clock signal terminal CKB is at a high level.

Since the signal provided by the first clock signal terminal CK is at the low level state, the second transistor T2 and the fourth transistor T4 are turned on. The low level signal provided by the signal input terminal INPUT is written to the third node N3 through the fourth transistor T4, and the voltages at the third node N3 and the fourth node N4 are at the low level state. At this time, the seventh transistor T7 is turned on.

Since the signal provided by the signal input terminal INPUT is at the low level state, the first transistor T1 is turned off, the third transistor T3 is turned on, and at this time, the high level voltage VGH provided by the second power terminal is written into the first node N1 through the third transistor T3, the voltage at the first node N1 is at the high level state, and the fifth transistor T5 and the eighth transistor T8 are both turned off.

Since the seventh transistor T7 is turned on, the low level voltage VGL provided by the first power terminal is written to the signal output terminal OUT through the seventh transistor T7, and thus the signal output terminal OUT outputs a low level signal. It should be noted that during the fifth stage, the voltage at the third node N3 and the fourth node N4 will slowly decrease, and the seventh transistor T7 will slowly switch from the off state to the on state, so that the signal output by the signal output terminal OUT is slowly switched from the high level state to the low level state. That is, during the fifth stage, the signal output terminal OUT actually outputs a high level signal and then outputs a low level signal. The timing at which the signal output terminal OUT outputs the low level signal is related to the discharging speed of the fourth node N4 (the operating state of the seventh transistor T7).

In a sixth stage t6', the signal provided by the signal input terminal INPUT is at a low level state, the signal provided by the first clock signal terminal CK is at a high level state, and the signal provided by the second clock signal terminal CKB is at a low level state.

Since the signal provided by the signal input terminal INPUT is at the low level state, the first transistor T1 is turned off, the third transistor T3 is turned on, and at this time, the high level voltage VGH provided by the second power terminal is written into the first node N1, the voltage at the first node N1 is at the high level state, and the fifth transistor T5 and the eighth transistor T8 are both turned off.

Since the signal provided by the first clock signal terminal CK is at the high level state, both the second transistor T2 and the fourth transistor T4 are turned off. At this time, the third node N3 and the fourth node N4 are in a floating state and remain in the low level in the previous stage. The seventh transistor T7 remains turned on.

Since the seventh transistor T7 is turned on, the low level voltage VGL provided by the first power terminal is written to the signal output terminal OUT through the seventh transistor T7, and thus the signal output terminal OUT outputs a low level signal.

In a seventh stage t7', the signal provided by the signal input terminal INPUT is at a low level state, the signal provided by the first clock signal terminal CK is at a low level state, and the signal provided by the second clock signal terminal CKB is at a high level state.

Since the signal provided by the signal input terminal INPUT is at the low level state, the first transistor T1 is turned off, the third transistor T3 is turned on, and at this time, the high level voltage VGH provided by the second power terminal is written into the first node N1 through the third transistor T3, the voltage at the first node N1 is at the high level state, and the fifth transistor T5 and the eighth transistor T8 are both turned off.

Since the signal provided by the first clock signal terminal CK is at the low level state, both the second transistor T3 and the fourth transistor T4 are turned on. A low level signal provided by the signal input terminal INPUT is written to the third node N3 through the fourth transistor T4 to perform the noise reduction processing on the third node N3, and voltages at the third node N3 and the fourth node N4 are at the low level state. At this time, the seventh transistor T7 is turned on.

Since the seventh transistor T7 is turned on, the low level voltage VGL provided by the first power terminal is written to the signal output terminal OUT through the seventh transistor T7, and thus the signal output terminal OUT outputs a low level signal.

It should be noted that according to the one-frame duration design, each period includes a plurality of sixth stages t6' and a plurality of seventh stages t7', which are performed alternately until the first stage of the next period starts.

Based on the above, the shift register shown in FIGS. 3A and 3B includes only 7 transistors: the first transistor T1, the second transistor T2, the third transistor T3, the fourth transistor T4, the fifth transistor T5, the seventh transistor T7, and the eighth transistor T8. Compared with the conventional 12T2C circuit (including 12 transistors and 2 capacitors), the shift register shown in FIGS. 3A and 3B has a simpler circuit structure, a smaller occupied size, and is more favorable for the narrow bezel design.

Figure 5A:
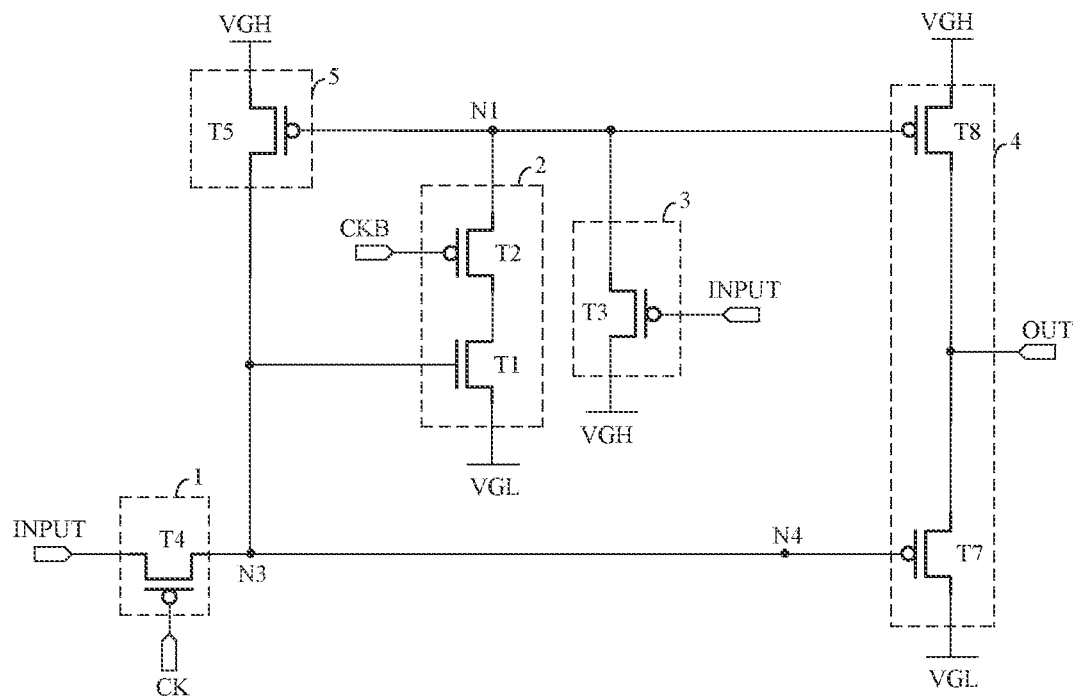
FIG. 5A is a schematic diagram of another circuit structure of a shift register according to an embodiment of the present disclosure.
Figure 5B:
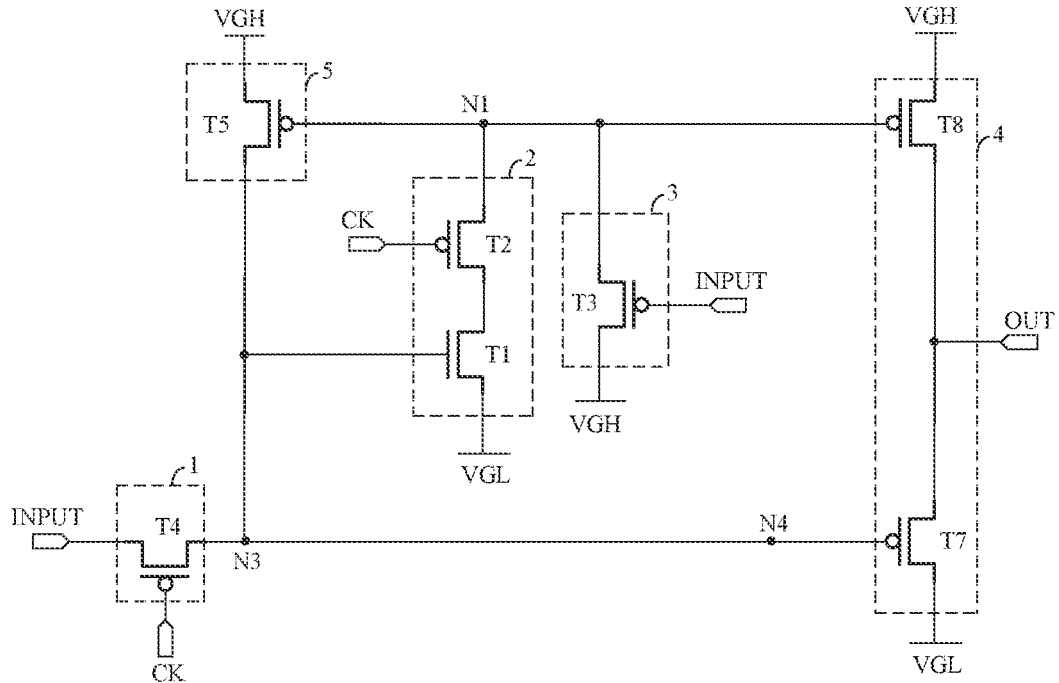
FIG. 5B is a schematic diagram of another circuit structure of a shift register according to an embodiment of the present disclosure.

FIG. 5A is a schematic diagram of another circuit structure of a shift register according to an embodiment of the present disclosure; FIG. 5B is a schematic diagram of another circuit structure of a shift register according to an embodiment of the present disclosure; as shown in FIG. 5A and FIG. 5B, the preset control signal terminal CS is the third node N3 in the embodiment of the present disclosure, unlike the above embodiments in which the preset control signal terminal CS is the signal input terminal INPUT. Specifically, the control electrode of the first transistor T1 in FIGS. 5A and 5B is coupled to the third node N3.

The operating timings of the shift register shown in FIG. 5A and FIG. 5B may also be respectively those shown in FIG. 4A and FIG. 4B, and the specific operating process may refer to the related description of FIG. 4A and FIG. 4B, which is not described again here. It should be noted that based on FIGS. 4A and 4B, a signal waveform at the third node N3 is similar to that at the signal input terminal INPUT, so the operating state of the first transistor T1 in the respective stages when the control electrode of the first transistor T1 is connected to the third node N3 is the same as the operating state of the first transistor T1 in the respective stages when the control electrode of the first transistor T1 is connected to the signal input terminal INPUT.

Figure 6A:
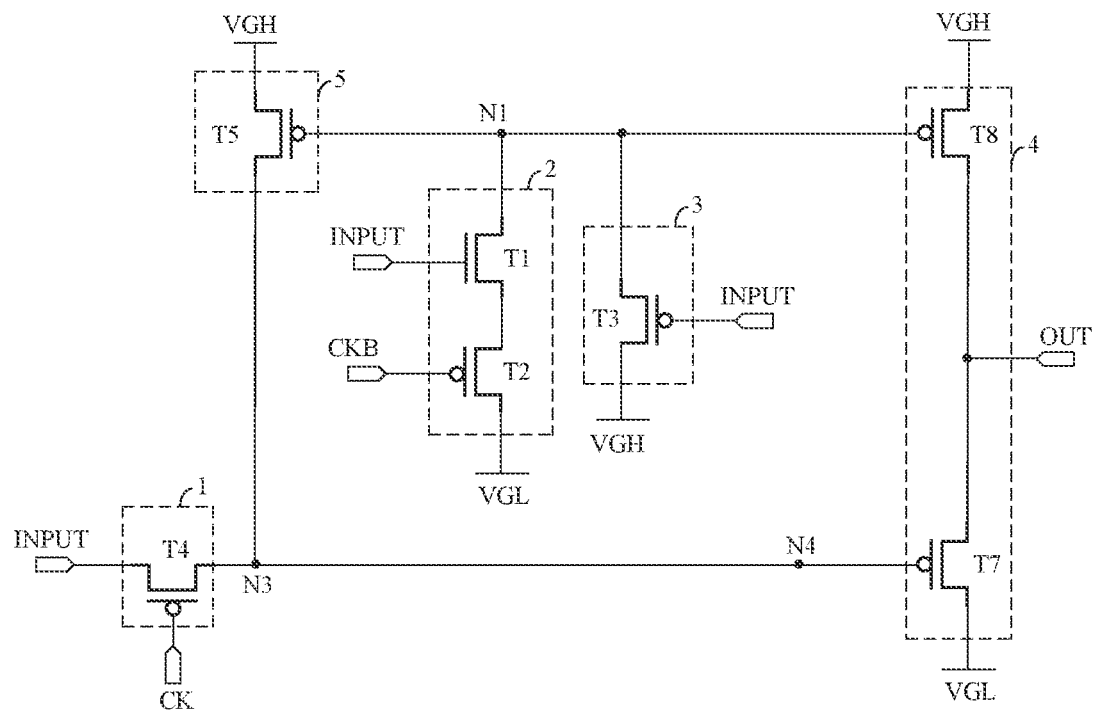
FIG. 6A is a schematic diagram of another circuit structure of a shift register according to an embodiment of the present disclosure.
Figure 6B:
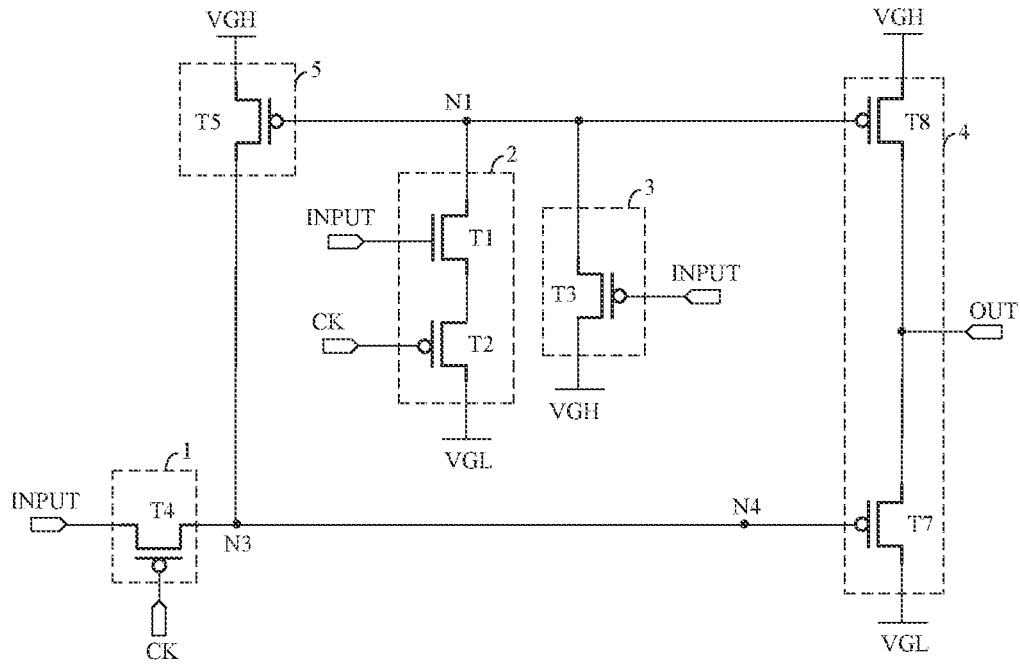
FIG. 6B is a schematic diagram of another circuit structure of a shift register according to an embodiment of the present disclosure.
Figure 7A:
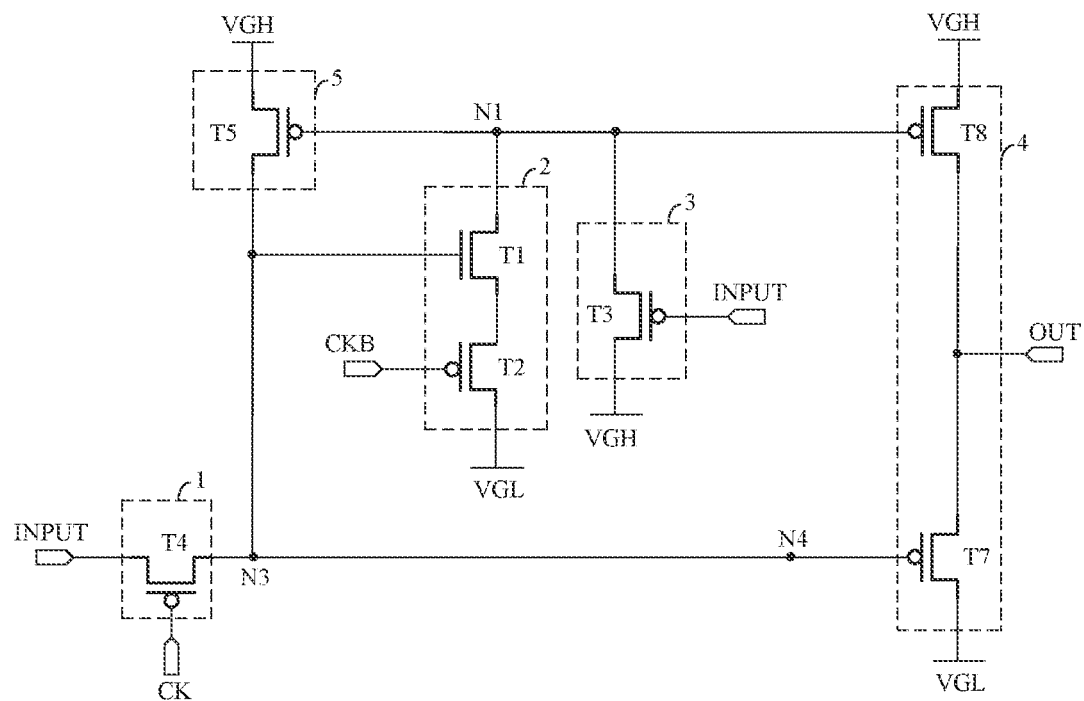
FIG. 7A is a schematic diagram of another circuit structure of a shift register according to an embodiment of the present disclosure.
Figure 7B:
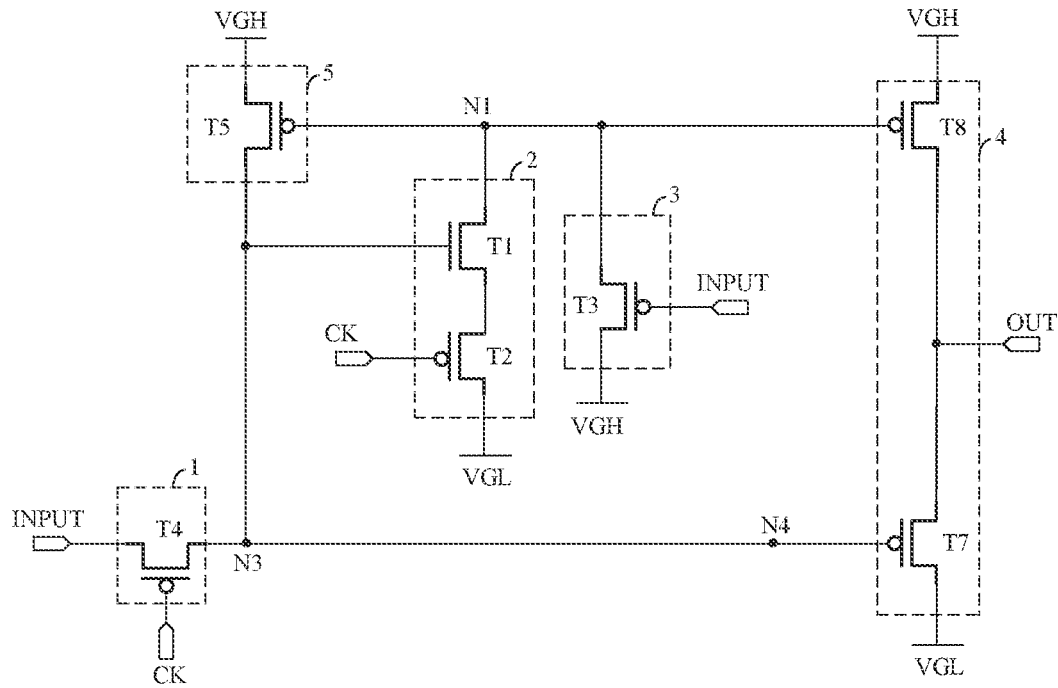
FIG. 7B is a schematic diagram of another circuit structure of a shift register according to an embodiment of the present disclosure.

FIG. 6A is a schematic diagram of another circuit structure of a shift register according to an embodiment of the present disclosure; FIG. 6B is a schematic diagram of another circuit structure of a shift register according to an embodiment of the present disclosure; FIG. 7A is a schematic diagram of another circuit structure of a shift register according to an embodiment of the present disclosure; FIG. 7B is a schematic diagram of another circuit structure of a shift register according to an embodiment of the present disclosure; as shown in FIGS. 6A, 6B, 7A and 7B, unlike the above embodiments, in the embodiments shown in FIGS. 6A, 6B, 7A and 7B, the control electrode of the first transistor T1 is coupled to the preset control signal terminal CS (the preset control signal terminal CS is the signal input terminal INPUT in FIGS. 6A and 6B, and the preset control signal terminal CS is the third node N3 in FIGS. 7A and 7B), the first electrode of the first transistor T1 is coupled to the second electrode of the second transistor T2, the second electrode of the first transistor T1 is coupled to the first node N1; the control electrode of the second transistor T2 is coupled to the second clock signal terminal CKB or the first clock signal terminal CK, and the first electrode of the second transistor T2 is coupled to the first power terminal.

The operating timing of the shift register shown in FIG. 6A and FIG. 7A may be referred to as that shown in FIG. 4A, and the operating timing of the shift register shown in FIG. 6B and FIG. 7B may be referred to as that shown in FIG. 4B, which is not repeated herein.

In the embodiments illustrated in FIGS. 3A, 3B, 5A, 5B, 6A, 6B, 7A, and 7B, the third node N3 is directly connected to the fourth node N4. During the first and sixth stages, the seventh transistor T7 outputs signals under control of the low level voltage at the fourth node N4. Generally, in order to ensure that the seventh transistor T7 may be in a fully turned on state in the first stage and the fifth stage (a gate-source voltage of the seventh transistor T7 is to be less than or equal to Vth_T7, Vth_T7 is a threshold voltage of the seventh transistor T7, and Vth_T7≤0V), the voltage at the fourth node N4 should be less than or equal to VGL (VGL is generally a negative voltage, for example, −9V), so as to ensure that the signal output terminal OUT may output the low level voltage VGL, which requires that the low level voltage provided by the signal input terminal INPUT is less than or equal to VGL.

Generally, in the gate driving circuit, the signal input terminal INPUT of the shift register at the first stage is coupled to a frame start signal terminal, and the signal input terminal INPUT of the shift register at any stage other than the first stage is coupled to the signal output terminal OUT of the shift register at the previous stage. That is, the low level voltage at the signal output terminal OUT of the shift register at the present stage is used as the low level voltage inputted at the signal input terminal INPUT of the shift register at the next stage. Based on this, it is necessary to cause the low level voltage provided by the frame start signal terminal to be VGL, so as to ensure that the voltage at the fourth node N4 is VGL when the shift register at each stage respectively operates in the first stage, the fifth stage and the seventh stage. However, in practical applications, considering IR Drop and other factors, it is found that when each shift register operates in the first stage, the fifth stage and the seventh stage, the actually loaded voltage VN4 is greater than VGL, and the voltage output by the signal output terminal OUT is VN4-Vth_T7 (the seventh transistor T7 is turned on, and when the voltage at the signal output terminal OUT is discharged to VN4-Vth_T7, the seventh transistor T7 is turned off), Vth_T7≤0, so that VN4-Vth_T7>VGL, that is, the signal output terminal OUT may not completely output VGL. When VN4 is too large, the low level voltage output by the signal output terminal OUT is too large, which may cause the low level voltage output by the signal output terminal OUT not to effectively control the light emitting control transistor in the pixel driving circuit.

Figure 8A:
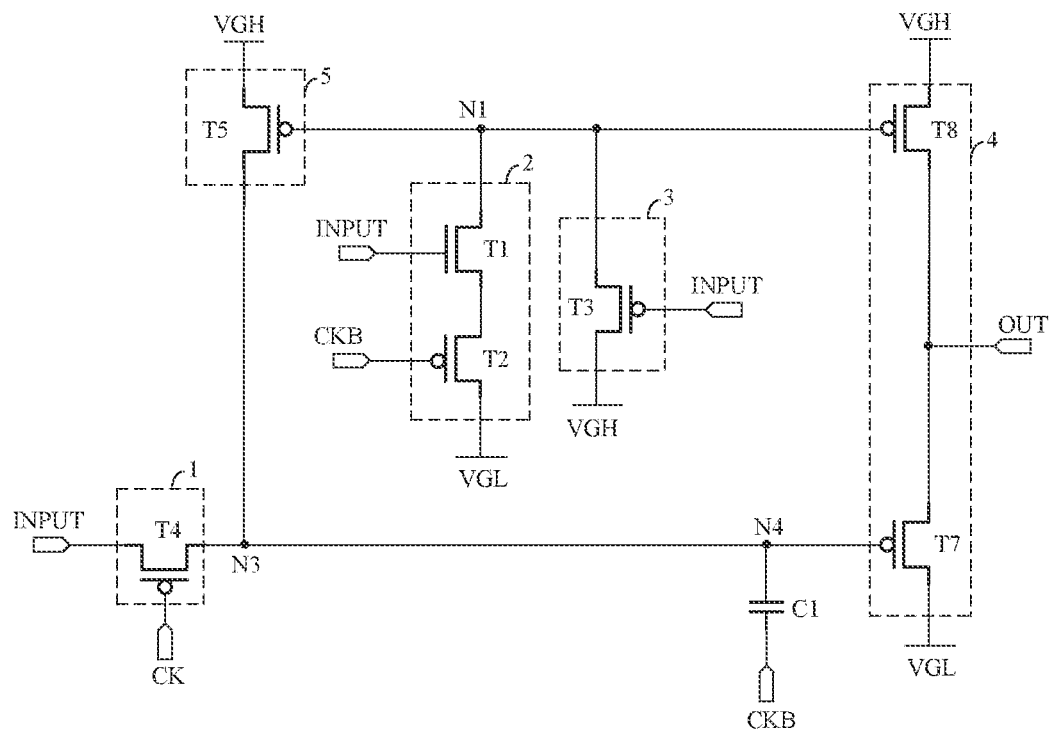
FIG. 8A is a schematic diagram of another circuit structure of a shift register according to an embodiment of the present disclosure.
Figure 8B:
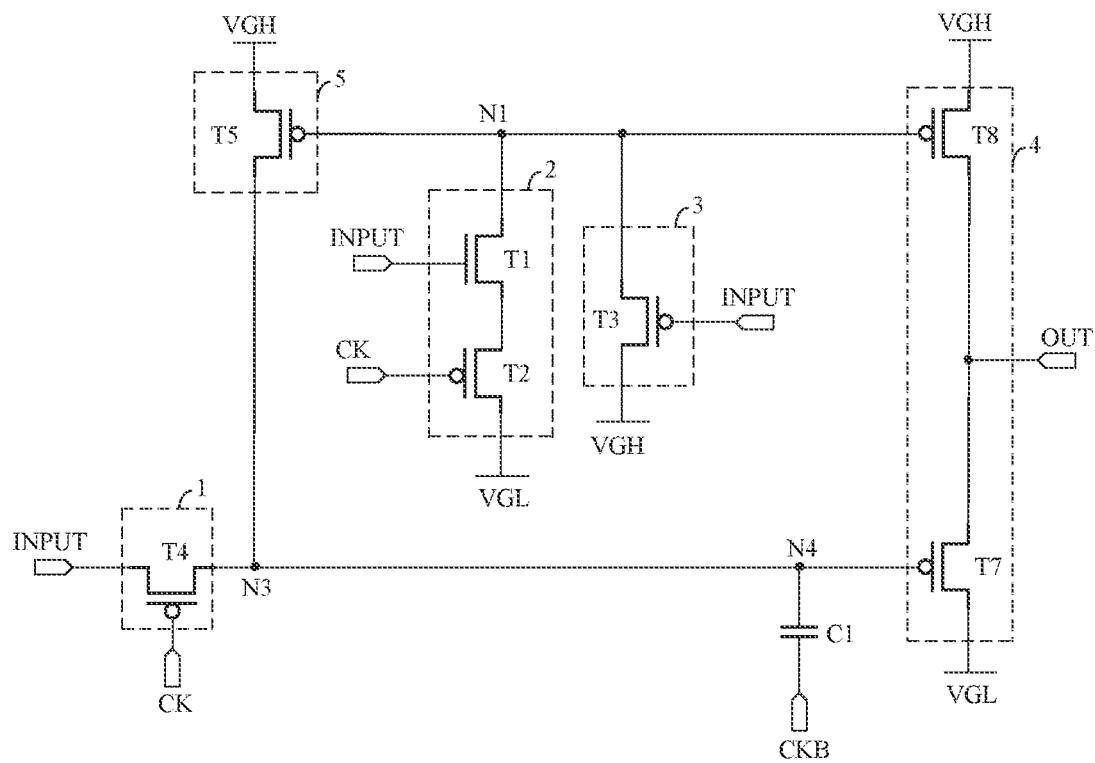
FIG. 8B is a schematic diagram of another circuit structure of a shift register according to an embodiment of the present disclosure.

In order to effectively solve the above technical problem, the embodiments of the present disclosure further provide a new shift register. FIG. 8A is a schematic diagram of another circuit structure of a shift register according to an embodiment of the present disclosure; FIG. 8B is a schematic diagram of another circuit structure of a shift register according to an embodiment of the present disclosure; as shown in FIG. 8A to FIG. 8B, unlike the shift register provided in the above embodiments, the shift register unit shown in FIG. 8A and FIG. 8B includes not only the circuit structure in the shift register, but also a first capacitor C1; the first terminal of the first capacitor C1 is coupled to the second clock signal terminal CKB, and the second terminal of the first capacitor C1 is coupled to the fourth node N4.

Figure 9A:
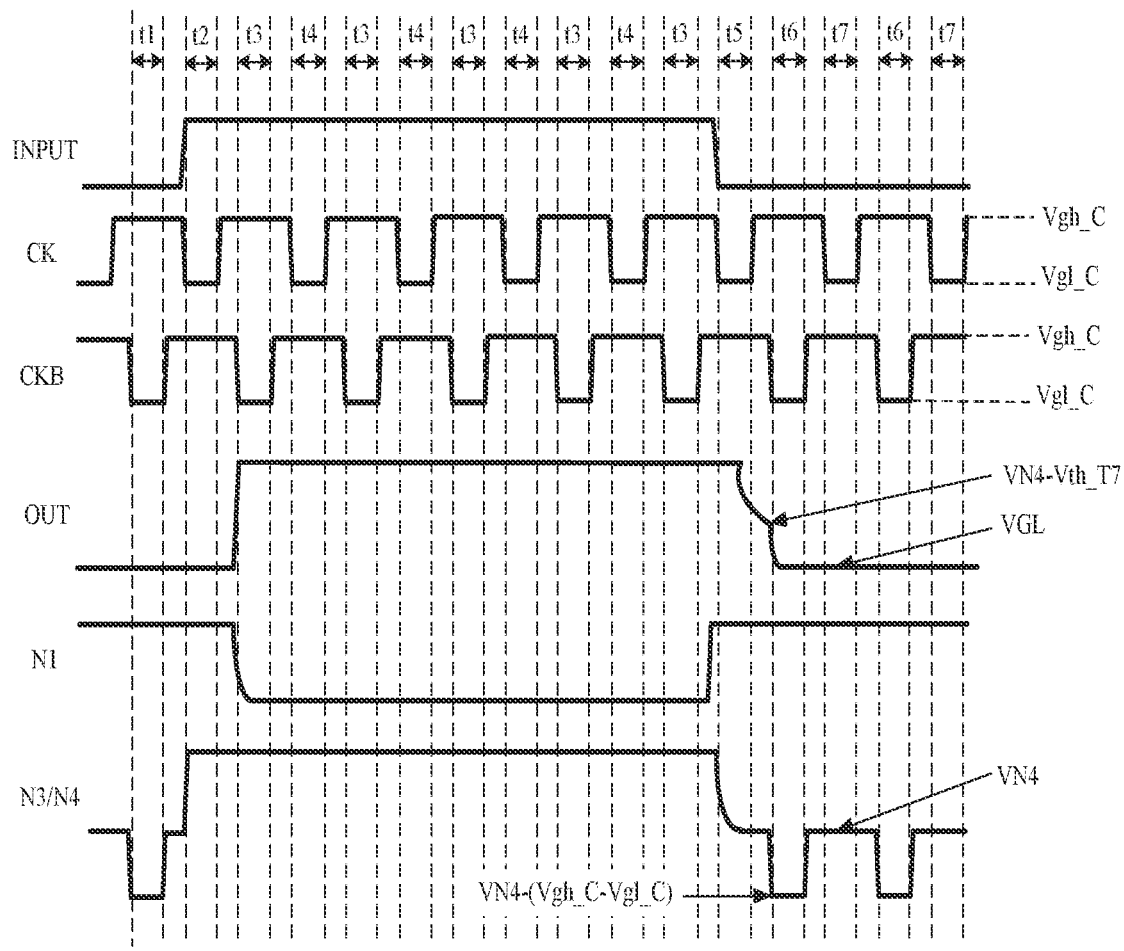
FIG. 9A is a timing diagram illustrating an operation of a shift register shown in FIG. 8A.
Figure 9B:
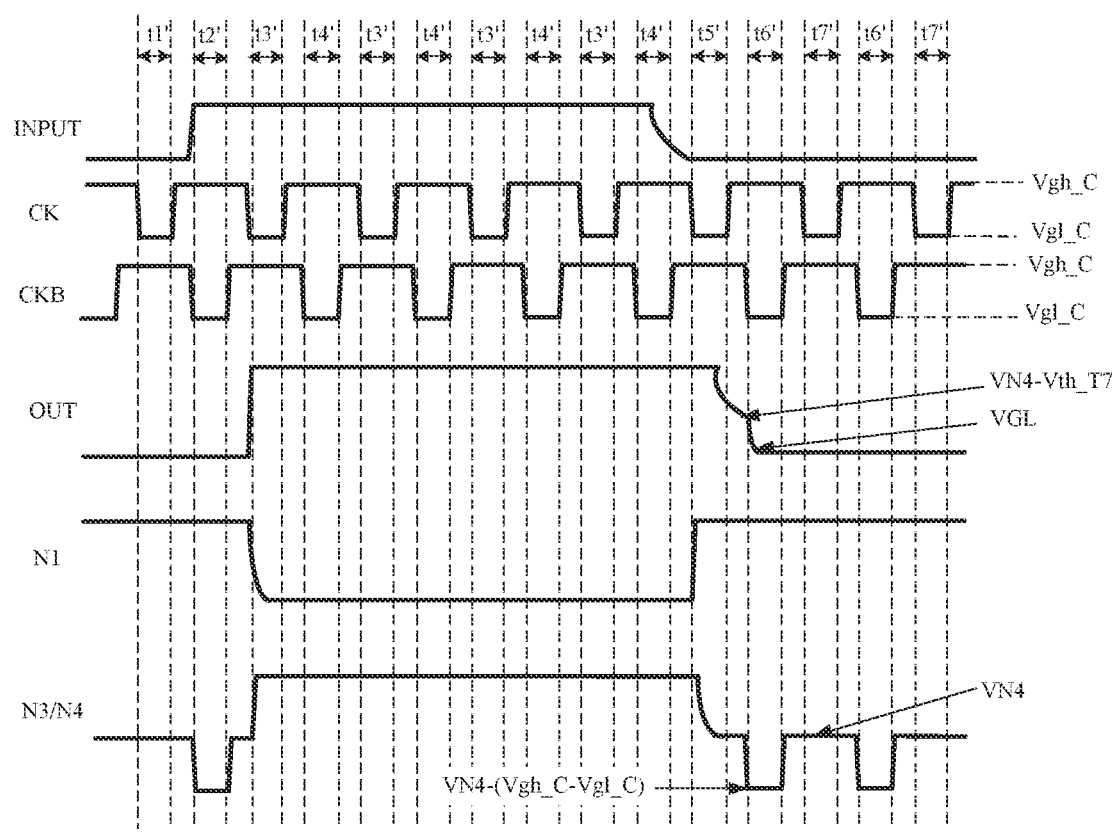
FIG. 9B is a timing diagram illustrating an operation of a shift register shown in FIG. 8B.

FIG. 9A is a timing diagram illustrating an operation of a shift register shown in FIG. 8A; FIG. 9B is a timing diagram illustrating an operation of a shift register shown in FIG. 8B. As shown in FIGS. 9A and 9B, the operation process of the shift register shown in FIG. 8A also includes the first stage t1 to the seventh stage t7 as described above, and the operation process of the shift register shown in FIG. 9A also includes the first stage t1' to the seventh stage t7' as described above, wherein in the first stages t1 and t1' and the fifth stages t5 and t5', since the third node N3 and the fourth node N4 are in the floating state, when the signal provided by the second clock signal terminal CKB is switched from the high level state to the low level state, the third node N3 and the fourth node N4 are pulled down by the bootstrap of the first capacitor C1.

For example, it is assumed that the voltage at the fourth node N4 is VN4 after the fifth stages t5 and t5' are ended and before the sixth stages t6 and t6' start, and the voltage output by the signal output terminal OUT is VN4-Vth_T7. After the sixth stage begins, when the voltage provided by the second clock signal terminal CKB is switched from the high level voltage Vgh_C to the low level voltage Vgl_C, the voltages at the third node N3 and the fourth node N4 are pulled down by the first capacitor C1 to VN4-(Vgh_C-Vgl_C), and a value of Vgh_C-Vgl_C is designed in advance so that VN4-(Vgh_C-Vgl_C) is smaller than VGL, and the seventh transistor T7 is in a fully turned state in the sixth stage, and the signal output terminal OUT may fully output the low level voltage VGL.

It should be noted that in the seventh stages t7 and t7', although the voltage at the fourth node N4 is also pulled up by the first capacitor C1 to the VN4, at this time, since the gate-source voltage of the seventh transistor T7 is greater than Vth_T7, the seventh transistor T7 is turned off in the seventh stages t7 and t7', the signal output terminal OUT is in the floating state, and still outputs the low level voltage VGL.

Similarly, in the first stages t1, t1', the voltage at the fourth node N4 is pulled down by the first capacitor C1 to VN4-(Vgh_C-Vgl_C), and the signal output terminal OUT outputs the low level voltage VGL.

Based on the above, it can be seen that the signal output terminal OUT can stably output the low level voltage VGL in the first stage, the sixth stage and the seventh stage by providing the first capacitor C1.

Figure 10A:
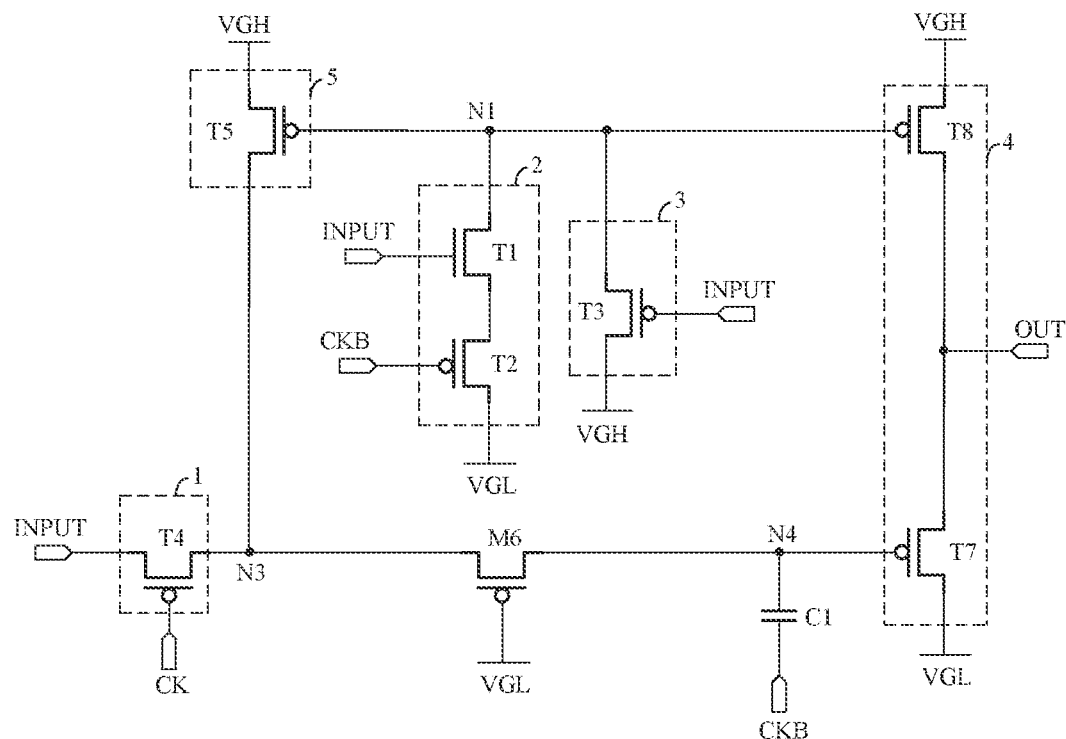
FIG. 10A is a schematic diagram of another circuit structure of a shift register according to an embodiment of the present disclosure.
Figure 10B:
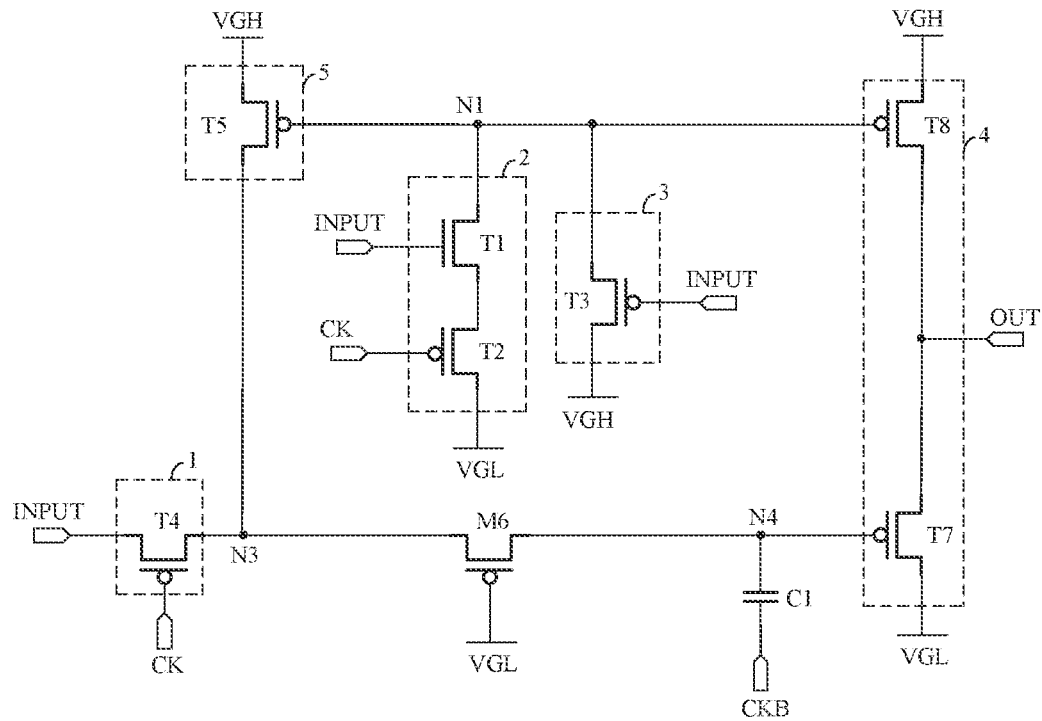
FIG. 10B is a schematic diagram of another circuit structure of a shift register according to an embodiment of the present disclosure.
Figure 11A:
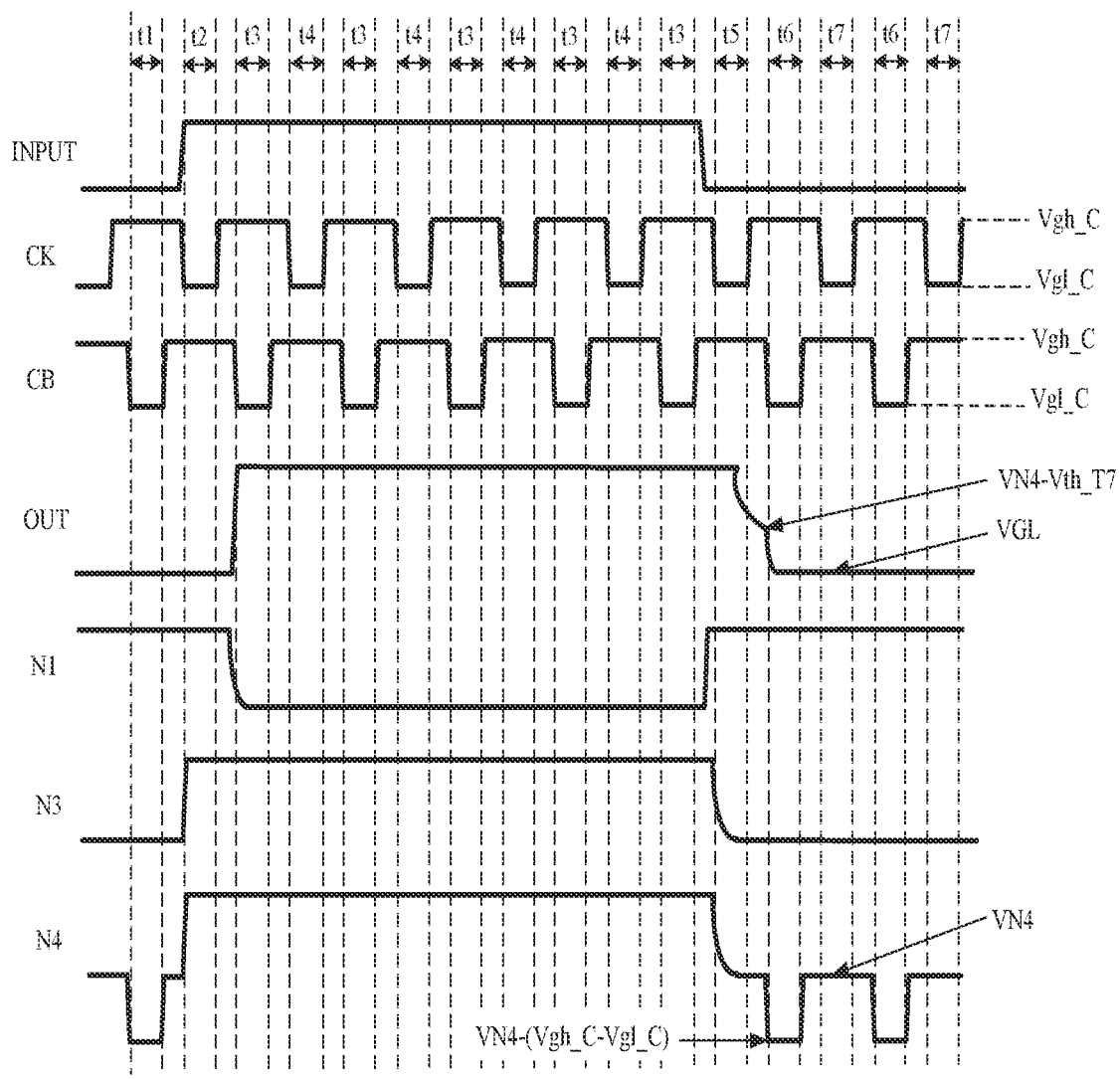
FIG. 11A is a timing diagram illustrating an operation of a shift register shown in FIG. 10A.
Figure 11B:
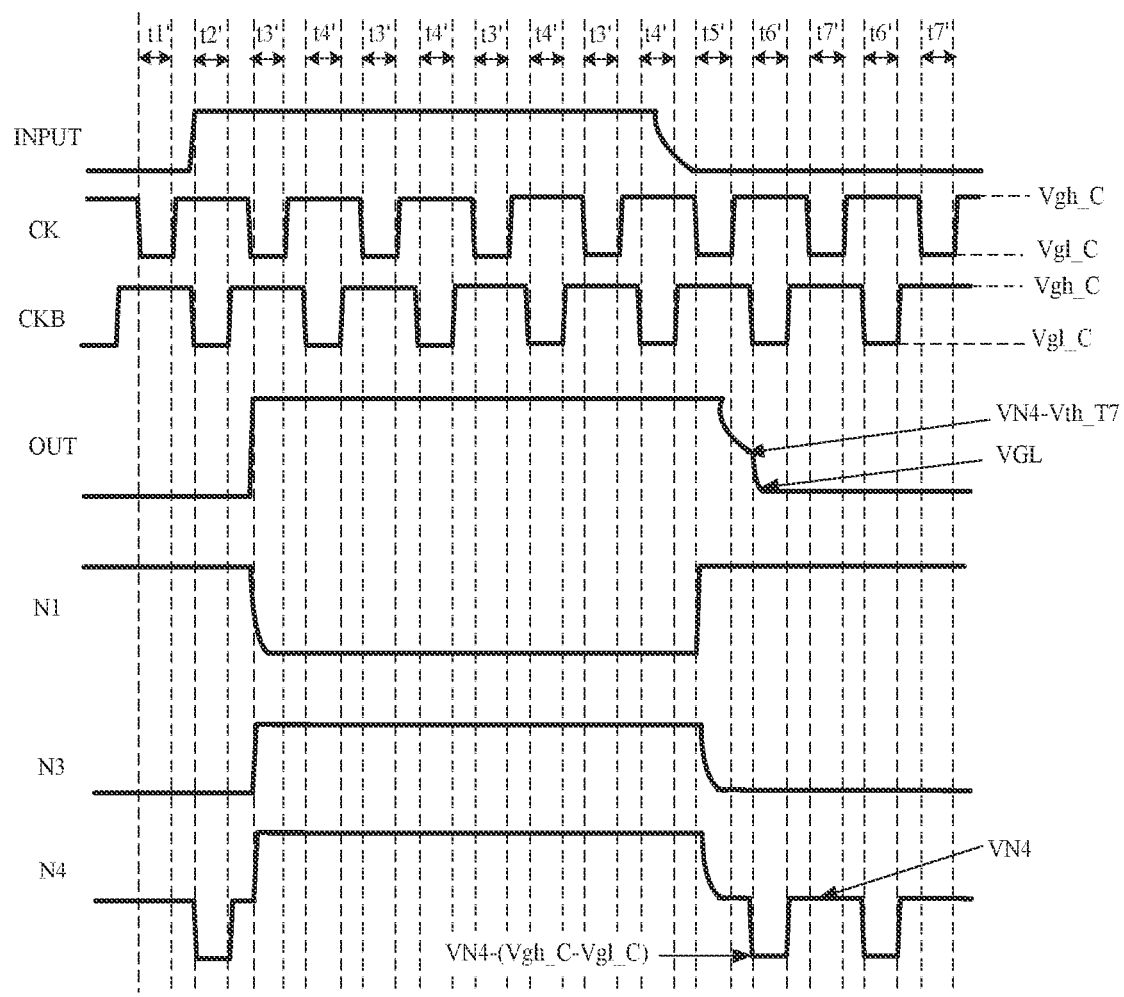
FIG. 11B is a timing diagram illustrating an operation of a shift register shown in FIG. 10B.

FIG. 10A is a schematic diagram of another circuit structure of a shift register according to an embodiment of the present disclosure; FIG. 10B is a schematic diagram of another circuit structure of a shift register according to an embodiment of the present disclosure; FIG. 11A is a timing diagram illustrating an operation of a shift register shown in FIG. 10A; FIG. 11B is a timing diagram illustrating an operation of a shift register shown in FIG. 10B; as shown in FIG. 10A to FIG. 11B, in some embodiments, the shift register includes not only the first capacitor C1 in FIG. 8A and FIG. 8B, but also a sixth transistor T6. The sixth transistor T6 is located between the third node N3 and the fourth node N4, and the third node N3 is coupled to the fourth node N4 through the sixth transistor T6; a control electrode of the sixth transistor T6 is coupled to the first power terminal, a first electrode of the sixth transistor T6 is coupled to the third node N3, and a second electrode of the sixth transistor T6 is coupled to the fourth node N4.

As can be seen from the timing shown in FIGS. 9A and 9B, since the third node N3 and the fourth node N4 are directly connected to each other in FIGS. 8A and 8B, the signals loaded on the third node N3 and the fourth node N4 always keep the same. During the first stages t1 and t1' and the sixth stages t6 and t6', the voltage at the third node N3 is extremely low (an extremely low negative voltage), and at this time, the fourth transistor T4 and the fifth transistor T5 are at a high voltage state (the first electrode and the second electrode of the transistors have a large voltage difference therebetween), which affects the service lives of the fourth transistor T4 and the fifth transistor T5.

In order to effectively improve the above technical problem, in the embodiment shown in FIGS. 10A and 10B, the sixth transistor T6 is disposed between the third node N3 and the fourth node N4, and the control electrode of the sixth transistor T6 is coupled to the first power terminal to receive the low level voltage VGL.

Referring to FIGS. 11A and 11B, during the first stages t1, t1' and the sixth stages t6, t6', when the voltage at the fourth node N4 is pulled down by the first capacitor C1 to VN4-(Vgh_C-Vgl_C), a gate-source voltage of the sixth transistor T6 is greater than its own threshold voltage, and then the sixth transistor T6 switches to the off state. Therefore, the extremely low negative voltage at the fourth node N4 may not be written into the third node N3, and the voltage at the third node N3 remains in the state in the fifth stage (at this time, the third node N3 is in a floating state), so that the fourth transistor T4 and the fifth transistor T5 can be effectively prevented from being in a high-voltage state, and the service lives of the fourth transistor T4 and the fifth transistor T5 can be ensured.

Figure 12A:
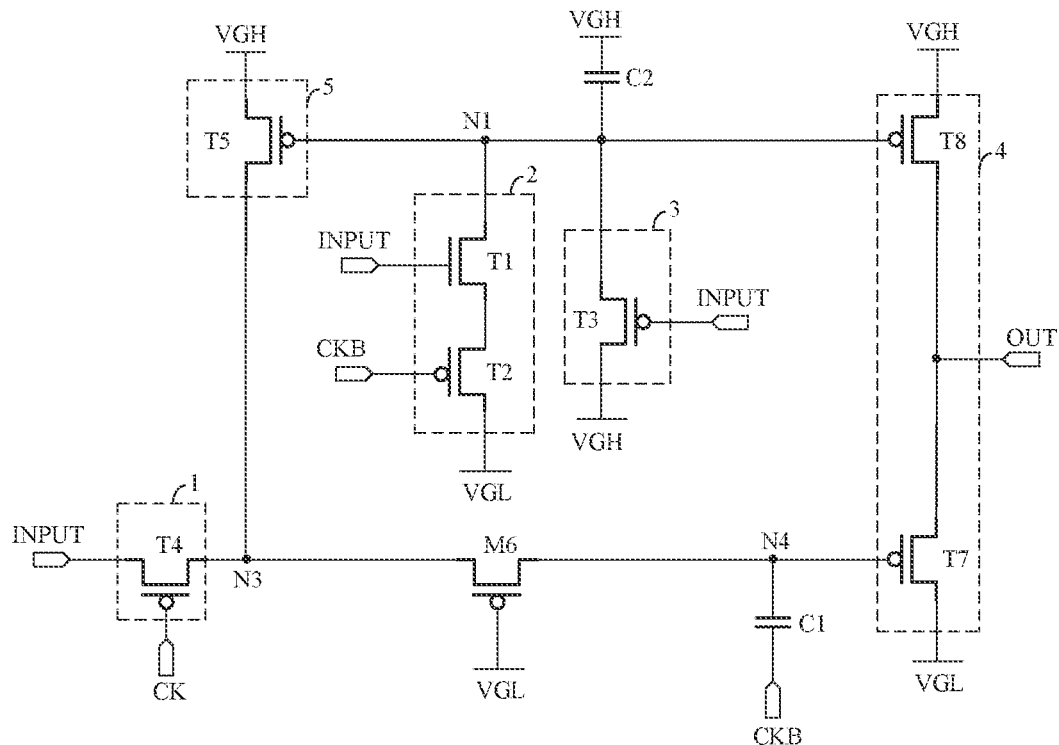
FIG. 12A is a schematic diagram of another circuit structure of a shift register according to an embodiment of the present disclosure.
Figure 12B:
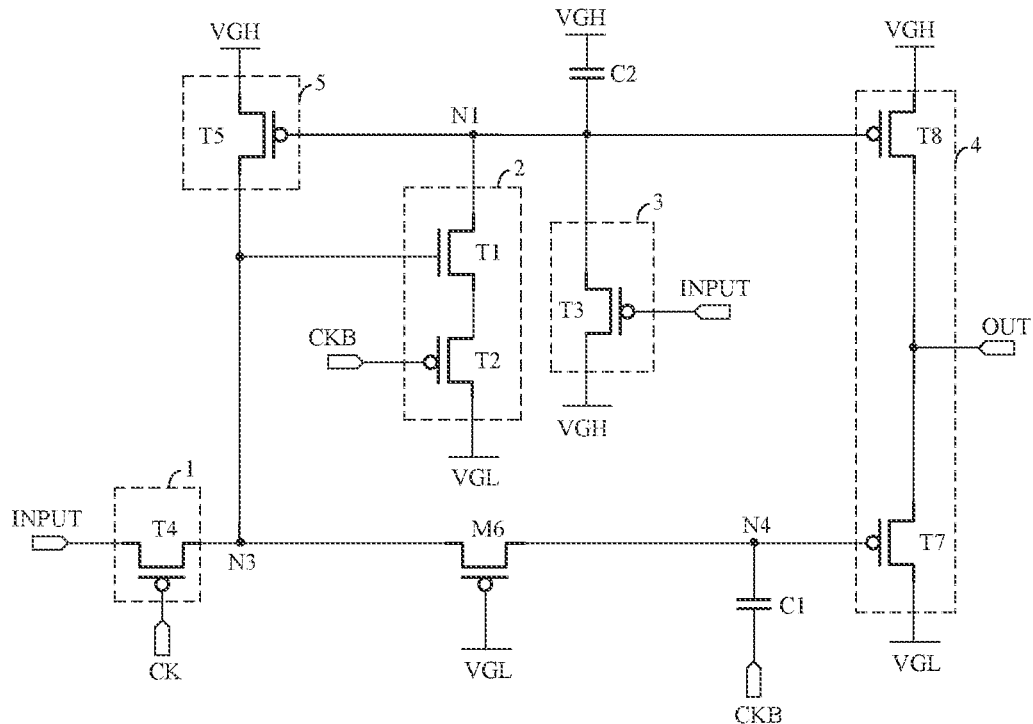
FIG. 12B is a schematic diagram of another circuit structure of a shift register according to an embodiment of the present disclosure.
Figure 12C:
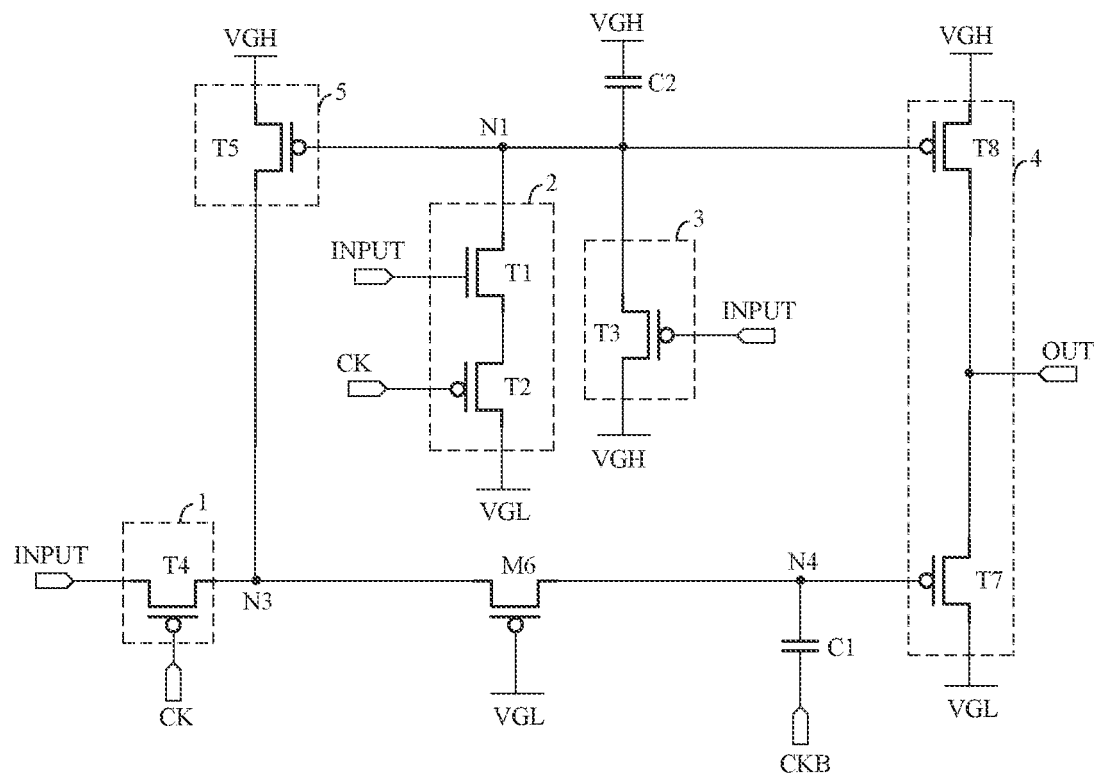
FIG. 12C is a schematic diagram of another circuit structure of a shift register according to an embodiment of the present disclosure.
Figure 12D:
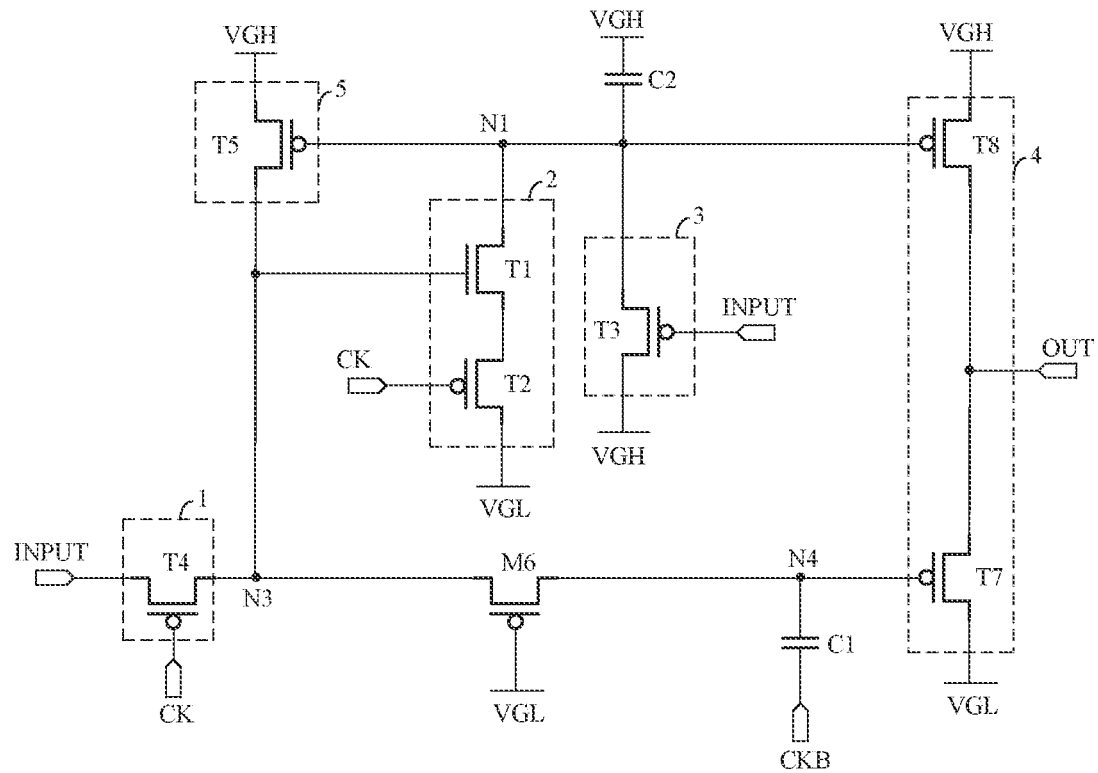
FIG. 12D is a schematic diagram of another circuit structure of a shift register according to an embodiment of the present disclosure.

FIG. 12A is a schematic diagram of another circuit structure of a shift register according to an embodiment of the present disclosure; FIG. 12B is a schematic diagram of another circuit structure of a shift register according to an embodiment of the present disclosure; FIG. 12C is a schematic diagram of another circuit structure of a shift register according to an embodiment of the present disclosure; FIG. 12D is a schematic diagram of another circuit structure of a shift register according to an embodiment of the present disclosure; as shown in FIG. 12A to FIG. 12D, unlike the above embodiments, the shift register shown in FIG. 12A to FIG. 12D further includes a second capacitor C2, a first terminal of the second capacitor C2 is coupled to the first node N1, and a second terminal of the second capacitor C2 is coupled to the first power terminal (this case is not shown in FIG. 12A to FIG. 12D) or the second power terminal (shown in FIG. 12A to FIG. 12D).

In the embodiment of the present disclosure, the first node N1 is in a floating state during the second stage and the fourth stage, and in order to maintain the voltage of the first node N1 stable in the second stage and the fourth stage, the second capacitor C2 is disposed at the first node N1 for stabilizing the voltage.

The shift register shown in FIGS. 12A to 12D is an 8T2C circuit (including 8 transistors and 2 capacitors), and compared with the conventional the 12T2C circuit, the shift register shown in FIGS. 12A to 12D has a simpler circuit structure, a smaller occupied size, and is more favorable for the narrow bezel design.

Figure 13:
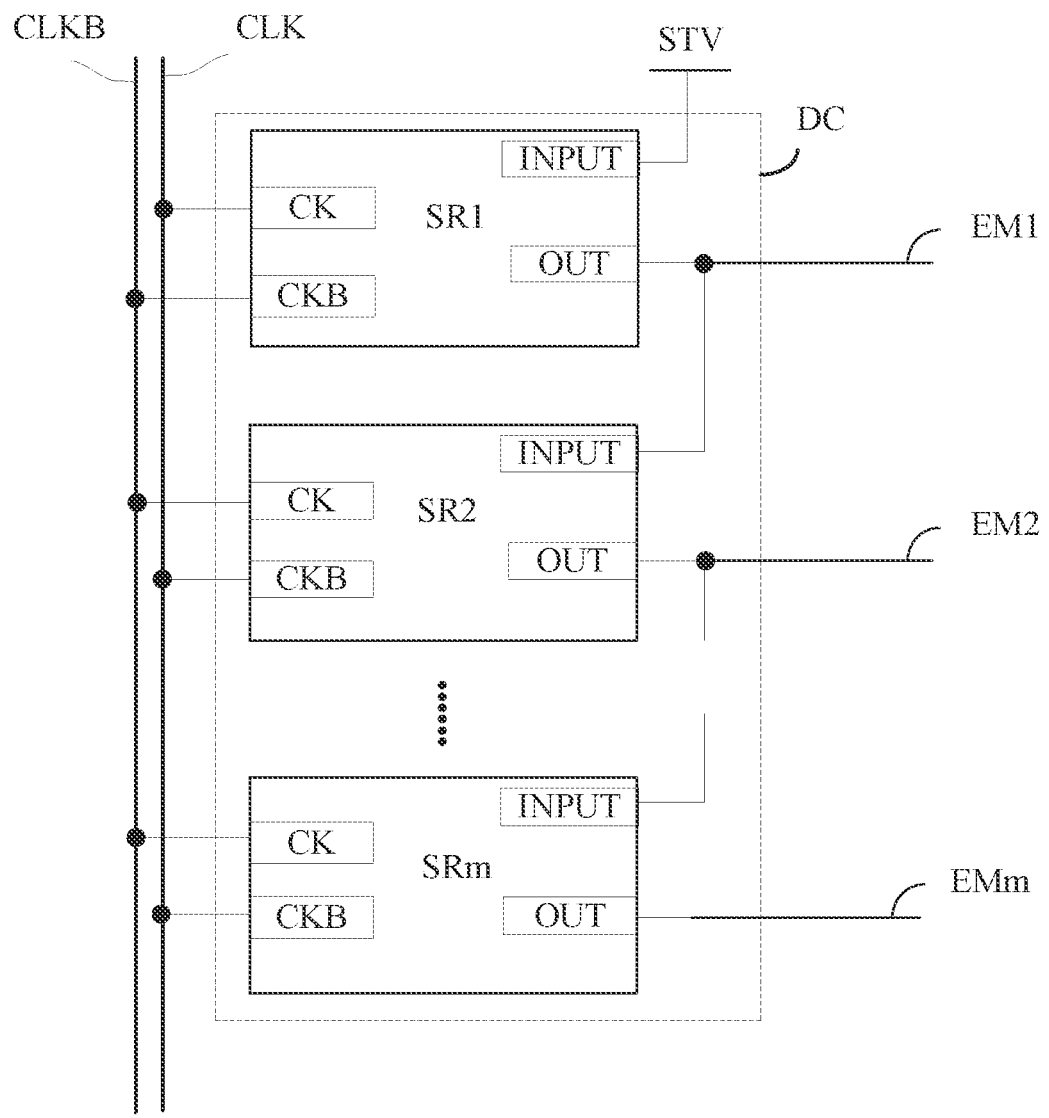
FIG. 13 is a schematic diagram of a circuit structure of a gate driving circuit according to an embodiment of the present disclosure.

Based on the same inventive concept, the embodiment of the present disclosure further provides a gate driving circuit. FIG. 13 is a schematic diagram of a circuit structure of a gate driving circuit according to an embodiment of the present disclosure. As shown in FIG. 13, the gate driving circuit DC includes: the plurality of cascaded shift registers SR1 to SRm, each of the shift registers SR1 to SRm adopts the shift registers provided by the above embodiments.

The signal input terminal INPUT of the shift register SR1 at the first stage is coupled to the frame start signal terminal STV; the signal input terminal INPUT of each of the shift registers SR2 to SRm except the shift register SR1 at the first stage is coupled to the signal output terminal OUT of the shift register of the previous stage. The signal output terminals OUT of the shift registers SR1 to SRm are further coupled to the light emitting control signal lines EM1 to EMm provided for corresponding pixel units in the display apparatus.

In some embodiments, two clock signal lines CLK, CLKB are further provided for the gate driving circuit DC: a first clock signal line CLK and a second clock signal line CLKB; the first clock signal terminals CK of the shift registers in odd stages are coupled to the first clock signal line CLK, and the second clock signal terminals CKB of the shift registers in even stages are coupled to the second clock signal line CLKB; the first clock signal terminals CK of the shift registers in even stages are coupled to the second clock signal line CLKB, and the second clock signal terminals CKB of the shift registers in odd stages are coupled to the first clock signal line CLK.

The embodiment of the present disclosure further provides a display apparatus, where the display apparatus includes a display substrate and an opposite substrate disposed opposite to the display substrate, and the display substrate provided in the above embodiments is adopted as the display substrate. For the description of the display substrate in the embodiment, reference may be made to the content in the above embodiments, and is not repeated here.

It should be noted that the display apparatus provided in this embodiment may be any product or component having a display function, such as an OLED panel, an OLED television, a QLED panel, a QLED television, a mobile phone, a tablet computer, a notebook computer, a digital photo frame, and a navigator or the like; the display apparatus may further include other components, such as a data driving circuit, a timing controller, and the like, which are not limited in the embodiments of the present disclosure.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A shift register, comprising:
   an input circuit coupled to a signal input terminal, a first clock signal terminal and a third node, and configured to write a signal from the signal input terminal to the third node in response to control of a signal from the first clock signal terminal;
   a first control circuit coupled to a first power terminal, a preset control signal terminal, a preset clock signal terminal and a first node, and configured to write a voltage from the first power terminal to the first node in response to control of signals from the preset control signal terminal and the preset clock signal terminal, wherein the first control circuit is directly coupled to the first node, and the preset control signal terminal is the signal input terminal;
   a second control circuit coupled to a second power terminal, the signal input terminal and the first node, and configured to write a voltage from the second power terminal to the first node in response to control of the signal from the signal input terminal; and
   an output circuit coupled to a signal output terminal, the first power terminal, the second power terminal, the first node and a fourth node, and configured to write the voltage from the second power terminal to the signal output terminal in response to control of a voltage at the first node, and to write the voltage from the first power terminal to the signal output terminal in response to control of a voltage at the fourth node, wherein the third node is coupled to the fourth node.

2. The shift register of claim 1, wherein the first control circuit comprises a first transistor and a second transistor;
   a control electrode of the first transistor is coupled to the preset control signal terminal, a first electrode of the first transistor is coupled to the first power terminal, and a second electrode of the first transistor is coupled to a first electrode of the second transistor; and
   a control electrode of the second transistor is coupled to the preset clock signal terminal, and a second electrode of the second transistor is coupled to the first node.

3. The shift register of claim 1, wherein the first control circuit comprises a first transistor and a second transistor;
   a control electrode of the first transistor is coupled to the preset control signal terminal, a first electrode of the first transistor is coupled to a second electrode of the second transistor, and a second electrode of the first transistor is coupled to the first node; and a control electrode of the second transistor is coupled to the preset clock signal terminal, and a first electrode of the second transistor is coupled to the first power terminal.

4. The shift register of claim 2, wherein the first transistor is an N-type transistor, and all transistors except the first transistor in the shift register are P-type transistors.

5. The shift register of claim 4, wherein the first transistor is a metal oxide transistor, and all transistors except the first transistor in the shift register are low temperature polysilicon transistors.

6. The shift register of claim 1, wherein the second control circuit comprises: a third transistor; and a control electrode of the third transistor is coupled to the signal input terminal, a first electrode of the third transistor is coupled to the second power terminal, and a second electrode of the third transistor is coupled to the first node.

7. The shift register of claim 1, wherein the input circuit comprises: a fourth transistor; and a control electrode of the fourth transistor is coupled to the first clock signal terminal, a first electrode of the fourth transistor is coupled to the signal input terminal, and a second electrode of the fourth transistor is coupled to the third node.

8. The shift register of claim 1, wherein the output circuit comprises a seventh transistor and an eighth transistor;

a control electrode of the seventh transistor is coupled to the fourth node, a first electrode of the seventh transistor is coupled to the first power terminal, and a second electrode of the seventh transistor is coupled to the signal output terminal; and a control electrode of the eighth transistor is coupled to the first node, a first electrode of the eighth transistor is coupled to the signal output terminal, and a second electrode of the eighth transistor is coupled to the second power terminal.

9. The shift register of claim 1, wherein the shift register further comprises: a noise reduction circuit coupled to the second power terminal, the first node and the third node, and configured to write the voltage from the second power terminal to the third node in response to control of a voltage at the first node.

10. The shift register of claim 9, wherein the noise reduction circuit comprises a fifth transistor; and a control electrode of the fifth transistor is coupled to the first node, a first electrode of the fifth transistor is coupled to the third node, and a second electrode of the fifth transistor is coupled to the second power terminal.

11. The shift register of claim 1, further comprising: a first capacitor;

wherein a first terminal of the first capacitor is coupled to a second clock signal terminal, and a second terminal of the first capacitor is coupled to the fourth node.

12. The shift register of claim 11, further comprising: a sixth transistor between the third node and the fourth node, wherein the third node is coupled to the fourth node through the sixth transistor; and a control electrode of the sixth transistor is coupled to the first power terminal, a first electrode of the sixth transistor is coupled to the third node, and a second electrode of the sixth transistor is coupled to the fourth node.

13. The shift register of claim 11, wherein the preset clock signal terminal is the first clock signal terminal or the second clock signal terminal.

14. The shift register of claim 1, further comprising: a second capacitor;

wherein a first terminal of the second capacitor is coupled to the first node, and a second terminal of the second capacitor is coupled to the first power terminal or the second power terminal.

15. A gate driving circuit, comprising: a plurality of shift registers cascaded, wherein each of the plurality of shift registers is the shift register of claim 1;

a signal input terminal of a shift register at the first stage is coupled to a frame start signal terminal; and a signal input terminal of a shift register at any stage other than the first stage is coupled to a signal output terminal of a shift register at a previous stage.

16. A display apparatus, comprising: the gate driving circuit of claim 15.

17. The shift register of claim 3, wherein the first transistor is an N-type transistor, and all transistors except the first transistor in the shift register are P-type transistors.

18. The shift register of claim 17, wherein the first transistor is a metal oxide transistor, and all transistors except the first transistor in the shift register are low temperature polysilicon transistors.

* * * * *